(12) United States Patent
Kusumoto et al.

(10) Patent No.: US 11,043,414 B2
(45) Date of Patent: Jun. 22, 2021

(54) MICROELECTRONIC DEVICES WITH CONDUCTIVE CONTACTS TO SILICIDE REGIONS, AND RELATED DEVICES

(71) Applicant: Micron Technology, Inc., Boise, ID (US)

(72) Inventors: Kenichi Kusumoto, Hiroshima (JP); Taizo Yasuda, Hiroshima (JP); Hidekazu Nobuto, Hiroshima (JP); Kohei Morita, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/654,865

(22) Filed: Oct. 16, 2019

(65) Prior Publication Data

US 2021/0118676 A1 Apr. 22, 2021

(51) Int. Cl.
*H01L 21/768* (2006.01)
*H01L 21/28* (2006.01)
*H01L 29/49* (2006.01)
*H01L 21/285* (2006.01)

(52) U.S. Cl.
CPC .. *H01L 21/76844* (2013.01); *H01L 21/28052* (2013.01); *H01L 21/28202* (2013.01); *H01L 21/76846* (2013.01); *H01L 21/76852* (2013.01); *H01L 21/76865* (2013.01); *H01L 21/76879* (2013.01); *H01L 21/28556* (2013.01); *H01L 29/4975* (2013.01); *H01L 2221/1073* (2013.01)

(58) Field of Classification Search
None
See application file for complete search history.

(56) References Cited

U.S. PATENT DOCUMENTS

| | | | |
|---|---|---|---|
| 5,644,166 A * | 7/1997 | Honeycutt | H01L 21/28518 257/754 |
| 6,091,148 A * | 7/2000 | Givens | H01L 21/76843 257/750 |
| 6,274,496 B1 | 8/2001 | Leusink et al. | |
| 2002/0019127 A1* | 2/2002 | Givens | H01L 21/76843 438/637 |
| 2003/0045093 A1* | 3/2003 | Givens | H01L 23/485 438/644 |
| 2019/0148522 A1* | 5/2019 | Wu | H01L 21/76844 257/365 |
| 2020/0203222 A1* | 6/2020 | Chang | H01L 29/66545 |

* cited by examiner

*Primary Examiner* — Steven B Gauthier
(74) *Attorney, Agent, or Firm* — TraskBritt

(57) ABSTRACT

Microelectronic devices—having at least one conductive contact structure adjacent a silicide region—are formed using methods that avoid unintentional contact expansion and contact reduction. A first metal nitride liner is formed in a contact opening, and an exposed surface of a polysilicon structure is thereafter treated (e.g., cleaned and dried) in preparation for formation of a silicide region. During the pretreatments (e.g., cleaning and drying), neighboring dielectric material is protected by the presence of the metal nitride liner, inhibiting expansion of the contact opening. After forming the silicide region, a second metal nitride liner is formed on the silicide region before a conductive material is formed to fill the contact opening and form a conductive contact structure (e.g., a memory cell contact structure, a peripheral contact structure).

9 Claims, 20 Drawing Sheets

MICROELECTRONIC DEVICES WITH CONDUCTIVE CONTACTS TO SILICIDE REGIONS, AND RELATED DEVICES

TECHNICAL FIELD

Embodiments of the disclosure relate to the field of microelectronic device design and fabrication. More specifically, embodiments of the disclosure relate to methods of forming an apparatus having contacts, and to related apparatuses, semiconductor devices, and electronic systems.

BACKGROUND

Semiconductor device designers often desire to increase the level of integration or density of features within a semiconductor device by reducing the dimensions of the individual features and by reducing the separation distance between neighboring features. In addition, semiconductor device designers often seek to design architectures that are not only compact, but offer performance advantages, as well as simplified designs.

One example of a semiconductor device is a memory device. Memory devices are generally provided as internal integrated circuits in computers or other electronic devices. There are many species of memory including, but not limited to, random-access memory (RAM), read-only memory (ROM), dynamic random access memory (DRAM), synchronous dynamic random access memory (SDRAM), FLASH memory, and resistance variable memory. Non-limiting examples of resistance variable memory include resistive random access memory (ReRAM), conductive bridge random access memory (conductive bridge RAM), magnetic random access memory (MRAM), phase change material (PCM) memory, phase change random access memory (PCRAM), spin-torque-transfer random access memory (STTRAM), oxygen vacancy-based memory, and programmable conductor memory.

A typical memory cell of a memory device includes an access device (e.g., a transistor) and a memory storage structure (e.g., a capacitor) electrically coupled to the access device through a conductive contact. The access device generally includes a channel region between a pair of source/drain regions, and a gate electrode configured to electrically connect the source/drain regions to one another through the channel region. The access devices can comprise planar access devices or vertical access devices. Planar access devices can be distinguished from vertical access devices based upon the direction of current flow between the source and drain regions thereof. Current flow between the source and drain regions of a vertical access device is primarily substantially orthogonal (e.g., perpendicular) to a primary (e.g., major) surface of a substrate or base structure thereunder, and current flow between source and drain regions of a planar access device is primarily parallel to the primary surface of the substrate or base thereunder.

The structures of and methods of fabricating conventional memory cells for memory devices can have less-than-desirable electrical properties. For example, a conductive contact included in conventional memory cell may employ cobalt disilicide ($CoSi_2$) to decrease contact electrical resistance and may also employ a metal nitride (e.g., TiN) liner to facilitate adhesion of a conductive structure (e.g., a conductive plug) to the $CoSi_2$. To form these materials, a contact opening may be formed to expose a surface of a polysilicon structure. Cleaning and drying are performed to remove impurities or other debris from the surface of the polysilicon. Then, cobalt is deposited on the cleaned and dried exposed polysilicon surface and is subjected to a heat treatment to form, from the cobalt and the polysilicon, the $CoSi_2$ at the surface of the polysilicon. Remaining cobalt (e.g., cobalt not converted into $CoSi_2$) is then removed (e.g., by etching or other "remnant-removal" act). The metal nitride (e.g., TiN) liner is then formed on the $CoSi_2$ and along sidewalls in the contact opening. Then, the conductive structure (e.g., the conductive plug) is formed.

The aforementioned cleaning, drying, and remnant-removal acts enable forming the silicide material with sufficient purity so as to provide sufficient electrical communication between the conductive contact structure to be formed and the polysilicon structure (e.g., which may include a source/drain region of the microelectronic device, such as a memory device). However, these same acts of conventional fabrication methods can lead to contact expansion (e.g., from contact openings becoming unintentionally broadened during the cleaning, drying, and cobalt-removal acts), leading to an increased risk of short-circuits and current leakage. Conventional efforts to prevent such problems, such as the inclusion of a protective dielectric structure (e.g., SiN) around the contact opening, are prone to causing other problems, such as contact reduction (e.g., reduced contact widths, reduced silicide region size, or both), leading to increased contact electrical resistance and decreased device performance.

For example, as illustrated in FIG. 1A, forming a conductive contact structure 102 (e.g., a conductive cell contact structure) by a conventional method may, ideally, seek to form the conductive contact structure 102 with a sufficient width WC (and therefore sufficient electronic connection) at an interface 104 between a silicide region 106 (e.g., a cobalt silicide region) and a first metal nitride liner 108 of one or more metal nitride liners (e.g., the first metal nitride liner 108, and a second metal nitride liner 110) of the conductive contact structure 102. Also, ideally, the silicide region 106 extends fully along an upper surface of a polysilicon structure 112. However, the reality of using conventional methods may result in unintentional contact expansion, as illustrated in FIG. 1B, or unintentional contact reduction, as illustrated in FIG. 1C.

In further regard to FIG. 1B, the contact expansion may result from, for example, the cleaning and drying of a contact opening, during conventional fabrication methods, to prepare the surface of the polysilicon structure 112 for formation of the cobalt thereon or, for additional example, from the removal of non-converted cobalt material after the cobalt silicide of the silicide region 106 has been formed. The cleaning, drying, and cobalt-removal acts may, unintentionally, remove all or portions of adjacent dielectric materials, such as a dielectric liner 114 (e.g., an SiN liner), a dielectric structure 116 (e.g., another SiN structure), and another dielectric structure 118 (e.g., an Sift structure), widening the contact opening during fabrication. The resulting unintentionally-broad conductive contact structure 102 of FIG. 1B may be at risk for short-circuits and current leakage with neighboring conductive regions (e.g., a bit line structure 120).

In further regard to FIG. 1C, conventional efforts to combat contact expansion by providing a thicker dielectric liner 114 adjacent the contact opening may result in unintentional contact reduction if, for example, not enough of the dielectric liner 114 is removed during the cleaning, drying, and cobalt-removing acts, particularly because controlling the amount of material removal, from the dielectric liner

114, during the cleaning, drying, and cobalt-removing acts is challenging. Using a thicker dielectric liner 114 also limits the amount of cobalt that can be formed on the polysilicon structure 112, and, therefore the size of the silicide region 106. With a reduced silicide region 106, the interface 104 is lessened, providing less physical and electrical connection between the silicide region 106 and, e.g., the first metal nitride liner 108. Therefore, the effective electrical resistance of the conductive structure will be increased, relative to that of the intended, ideal of FIG. 1A.

FIG. 1A to FIG. 1C illustrate the challenges of conventional fabrication methods and structures for conductive contact structure 102 in the form of a conductive memory cell contact. Conventional fabrication methods also provide the aforementioned challenges of contact expansion and contact reduction with other types of conductive contact structures, including peripheral contact structures, as illustrated in FIG. 2A to FIG. 2C.

As illustrated in FIG. 2A, an idealized fabrication of a conductive contact structure 202 (e.g., a peripheral contact structure) would form the conductive contact structure 202 so that an interface 204 with a silicide region 206 is of desired width as to form sufficient electrical contact. The interfacing materials may be at least one metal nitride liner (e.g., a first metal nitride liner 208 or more than one metal nitride liner that also includes a second metal nitride liner 210) and a silicide (e.g., cobalt silicide), of the silicide region 206, formed in a portion of a surface of a polysilicon structure 212 (e.g., a substrate). Ideally, no dielectric liner (e.g., dielectric liner 214 of FIG. 2C) would be needed, with neighboring dielectric materials (e.g., of a dielectric structure 216 and another dielectric structure 218) remaining intact subsequent to forming a contact opening to be occupied by the first metal nitride liner 208, the second metal nitride liner 210, and the conductive contact structure 202. However, as with the discussion of FIG. 1B and FIG. 1C above, the realities of using conventional fabrication methods may result in contact expansion, as illustrated in FIG. 2B, or contract reduction, as illustrated in FIG. 2C. That is, the cleaning, drying, and remnant-cobalt removing acts, during conventional fabrication methods, may lead to the contact opening expanding as dielectric material (e.g., of the dielectric structure 216 and the other dielectric structure 218) are unintentionally removed, particularly in the absence of a protective dielectric liner (e.g., the dielectric liner 214 of FIG. 2C). With such contact expansion, there is an increased risk for short-circuiting and current leakage between the conductive contact structure 202 and other conductive structures (e.g., a gate 220) nearby. Alternatively, the use of a protective dielectric liner such as the dielectric liner 214 of FIG. 2C, may result in contact reduction (e.g., if all or not enough of such dielectric liner is removed during the cleaning, drying, etc., acts), with a smaller silicide region 206 (e.g., compared to that of the FIG. 2A or FIG. 2B) and with the conductive contact structure 202 having a lesser width (e.g., compared to that of FIG. 2A and FIG. 2B). The contact reduction therefore leads to higher electrical resistance in the conductive contact structure 202, hampering the performance of the conductive contact structure 202.

Accordingly, reliably forming conductive contact structures (e.g., memory cell contact structures and peripheral contact structures) adjacent silicide regions continues to present challenges.

BRIEF DESCRIPTION OF THE DRAWINGS

FIG. 1A through FIG. 1C are cross-sectional, elevational schematic illustrations of hypothetical microelectronic device structures, wherein:

FIG. 1A illustrates a hypothetical microelectronic device structure with a cell contact structure formed by an idealized conventional method;

FIG. 1B illustrates a hypothetical microelectronic device structure with a cell contact structure exhibiting unintentional contact expansion, due to challenges of a conventional fabrication method; and FIG. 1C illustrates a hypothetical microelectronic device structure with a cell contact structure exhibiting unintentional contact reduction, due to challenges of a conventional fabrication method.

FIG. 2A through FIG. 2C are cross-sectional, elevational schematic illustrations of hypothetical microelectronic device structures, wherein:

FIG. 2A illustrates a hypothetical microelectronic device structure with peripheral contact structures formed by an idealized conventional method;

FIG. 2B illustrates a hypothetical microelectronic device structure with peripheral contact structures exhibiting unintentional contact expansion, due to challenges of a conventional fabrication method; and FIG. 2C illustrates a hypothetical microelectronic device structure with peripheral contact structures exhibiting unintentional contact reduction, due to challenges of a conventional fabrication method.

DETAILED DESCRIPTION

Figure 1A:
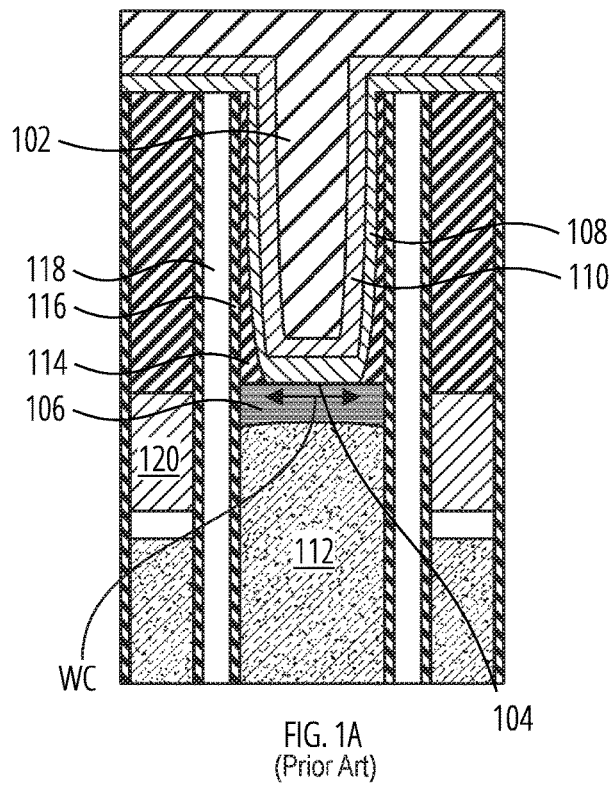
Figure 1B:
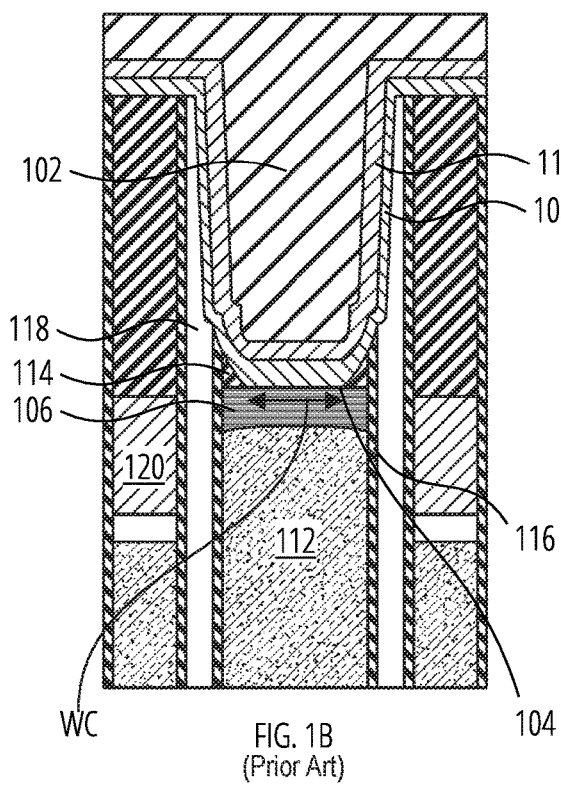
Figure 1C:
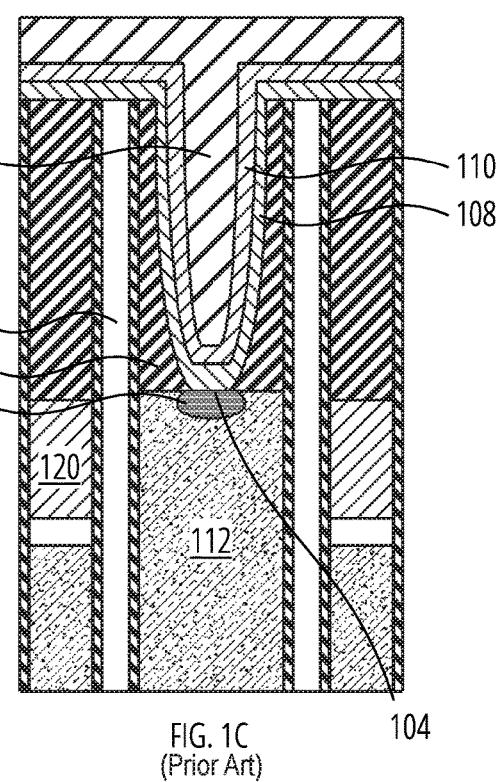

Structures (e.g., microelectronic device structures), apparatuses (e.g., microelectronic devices, such as memory devices), and systems (e.g., electronic systems), according to embodiments of the disclosure, include one or more conductive contact structures, each leading to a silicide region formed in a polysilicon structure. The conductive contact structures are lined, laterally, by a first metal nitride liner formed in a contact opening before cleaning and drying acts. The conductive contact structure is also lined, both laterally and below, by a second metal nitride liner. During formation, the first metal nitride liner protects adjacent dielectric material in which the contact opening was formed, inhibiting removal of the dielectric material to inhibit the contact opening from unintentionally widening. The use of the first metal nitride liner also avoids the need for a conventional, thick dielectric liner (e.g., dielectric liner 114 of FIG. 1C, dielectric liner 214 of FIG. 2C) within the contact opening; therefore, the risk of unintentional contact reduction is also avoided. The methods described herein enable precise control of the lateral dimension (e.g., width, diameter) of the conductive contact structures, e.g., on the order of several nanometers and even with high-aspect ratio contact openings and the use of cleaning, drying, and etching processing acts.

As used herein, the term "opening" means a volume extending through at least one structure or at least one material, leaving a gap in that at least one structure or at least one material, or a volume extending between structures or materials, leaving a gap between the structures or materials. Unless otherwise described, an "opening" is not necessarily empty of material. That is, an "opening" is not necessarily void space. An "opening" formed in or between structures or materials may comprise structure(s) or material(s) other than that in or between which the opening is formed. And, structure(s) or material(s) "exposed" within an opening is(are) not necessarily in contact with an atmosphere or non-solid environment. Structure(s) or material(s) "exposed" within an opening may be adjacent or in contact with other structure(s) or material(s) that is(are) disposed within the opening.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, structures, or junctions in the base semiconductor structure or foundation.

As used herein, the terms "horizontal" or "lateral" mean and include a direction that is parallel to a primary surface of the substrate on which the referenced material or structure is located. The width and length of a respective material or structure may be defined as dimensions in a horizontal plane.

As used herein, the terms "vertical" or "longitudinal" mean and include a direction that is perpendicular to a primary surface of the substrate on which a referenced material or structure is located. The height of a respective material or structure may be defined as a dimension in a vertical plane.

As used herein, the terms "thickness" or "thinness" mean and include a dimension in a straight-line direction that is normal to the closest surface of an immediately adjacent material or structure that is of a different composition or that is otherwise distinguishable from the material or structure whose thickness, thinness, or height is discussed.

As used herein, the term "between" is a spatially relative term used to describe the relative disposition of one material, structure, or sub-structure relative to at least two other materials, structures, or sub-structures. The term "between" may encompass both a disposition of one material, structure, or sub-structure directly adjacent the other materials, structures, or sub-structures and a disposition of one material, structure, or sub-structure indirectly adjacent to the other materials, structures, or sub-structures.

As used herein, the term "proximate" is a spatially relative term used to describe disposition of one material, structure, or sub-structure near to another material, structure, or sub-structure. The term "proximate" includes dispositions of indirectly adjacent to, directly adjacent to, and internal to.

As used herein, the term "neighboring," when referring to a material or structure, means and refers to a next, most proximate material or structure of an identified composition or characteristic. Materials or structures of other compositions or characteristics than the identified composition or characteristic may be disposed between one material or structure and its "neighboring" material or structure of the identified composition or characteristic. For example, a structure of material X "neighboring" a structure of material Y is the first material X structure, e.g., of multiple material X structures, that is next most proximate to the particular structure of material Y. The "neighboring" material or structure may be directly or indirectly proximate the structure or material of the identified composition or characteristic.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0% met, at least 95.0% met, at least 99.0% met, or even at least 99.9% met.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

Formulae (e.g., chemical compound formulae) used herein and including one or more of "x," "y,"and "z" represent a material that contains an average ratio of "x" atoms of one element, "y" atoms of another element, and/or "z" atoms of an additional element (if any). As the formulae are representative of relative atomic ratios and not strict chemical structure, the material may comprise one or more stoichiometric compounds and/or one or more non-stoichiometric compounds, and values of "x," "y,"and/or "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions.

As used herein, the terms "comprises," "comprising," "includes," and/or "including" specify the presence of stated features, structures, stages, operations, elements, materials, components, and/or groups, but do not preclude the presence or addition of one or more other features, structures, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

As used herein, the terms "configured" and "configuration" mean and refer to a size, shape, material composition, orientation, and arrangement of a referenced material, structure, assembly, or apparatus so as to facilitate a referenced operation or property of the referenced material, structure, assembly, or apparatus in a predetermined way.

The illustrations presented herein are not meant to be actual views of any particular material, structure, substructure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, in order to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

Reference will now be made to the drawings, where like numerals refer to like components throughout. The drawings are not necessarily drawn to scale.

By the methods of the disclosure, an apparatus with a conductive contact structure is formed by a method that does not risk contact expansion or contact reduction. With the description provided below, it will be readily apparent, to one of ordinary skill in the art, that the methods described herein may be used in fabrication of various devices (e.g., microelectronic devices). In other words, the methods of the disclosure may be used whenever it is desired to form an apparatus with a conductive contact structure, such as a conductive contact structure adjacent a silicide region formed by method acts that include cleaning, drying, or remnant-removal acts.

FIG. 3 through FIG. 10 are simplified cross-sectional views illustrating embodiments of a method of forming an apparatus (e.g., a microelectronic device, such as a semiconductor device, a memory device, a DRAM device) with a conductive cell contact structure.

Figure 3:
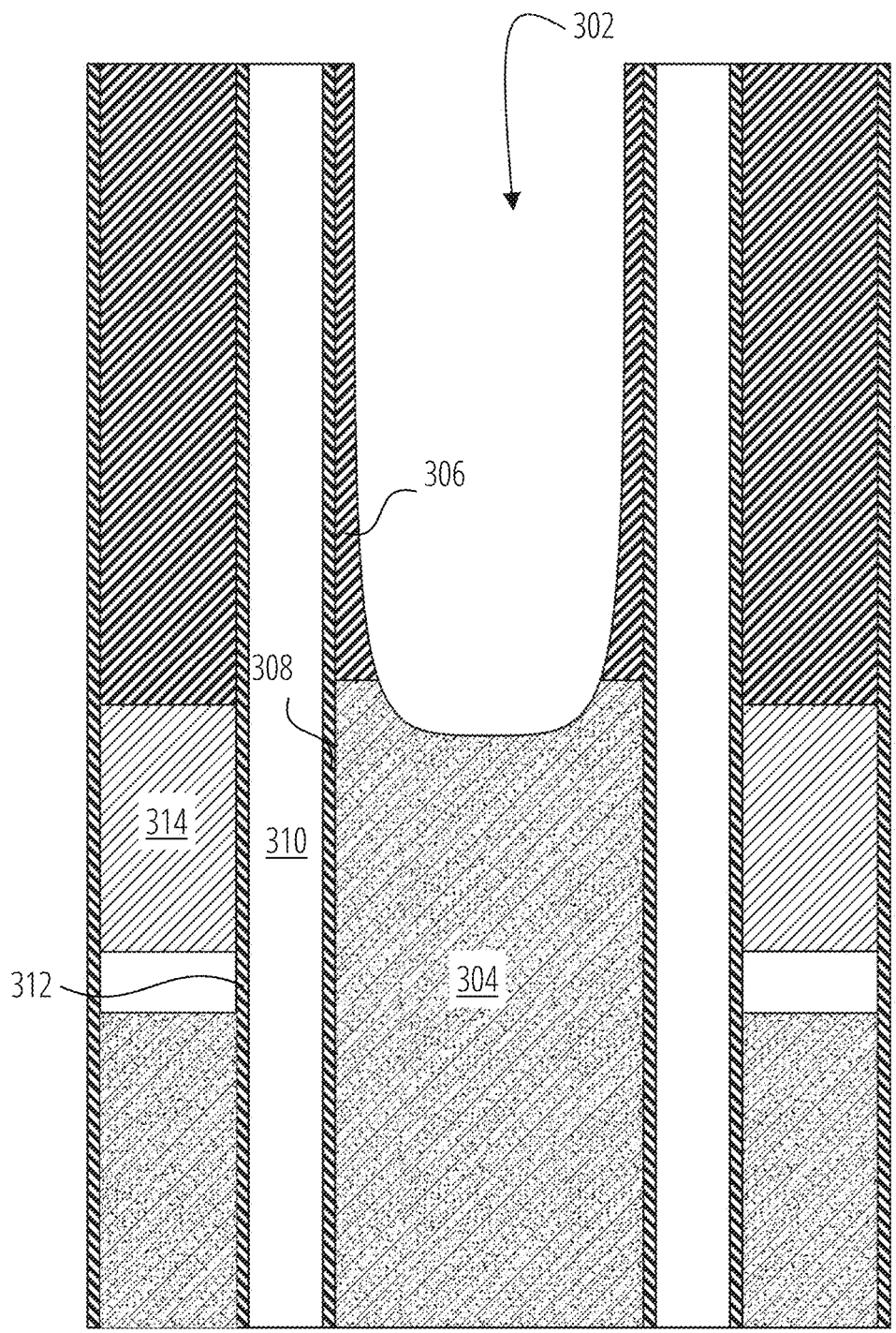
FIG. 3 through FIG. 10 are cross-sectional, elevational, schematic illustrations during various stages of processing to fabricate a microelectronic device structure, illustrated in FIG. 10, with a cell contact structure, according to embodiments of the disclosure.

With reference to FIG. 3, a contact opening 302 is formed (e.g., etched) through at least one dielectric material to expose a surface of a polysilicon structure 304. For example, the contact opening 302 of FIG. 3 is formed through a dielectric liner 306 (e.g., SiN), neighboring additional dielectric materials, such as a dielectric structure 308 (e.g., SiN), another dielectric structure 310 (e.g., $SiO_2$), and an additional dielectric structure 312 (e.g., SiN). The dielectric structure 308, the other dielectric structure 310, and the additional dielectric structure 312 may be disposed between the polysilicon structure 304 and a bit line structure 314 already formed by methods known in the art, which are therefore not described in detail herein.

Figure 4:
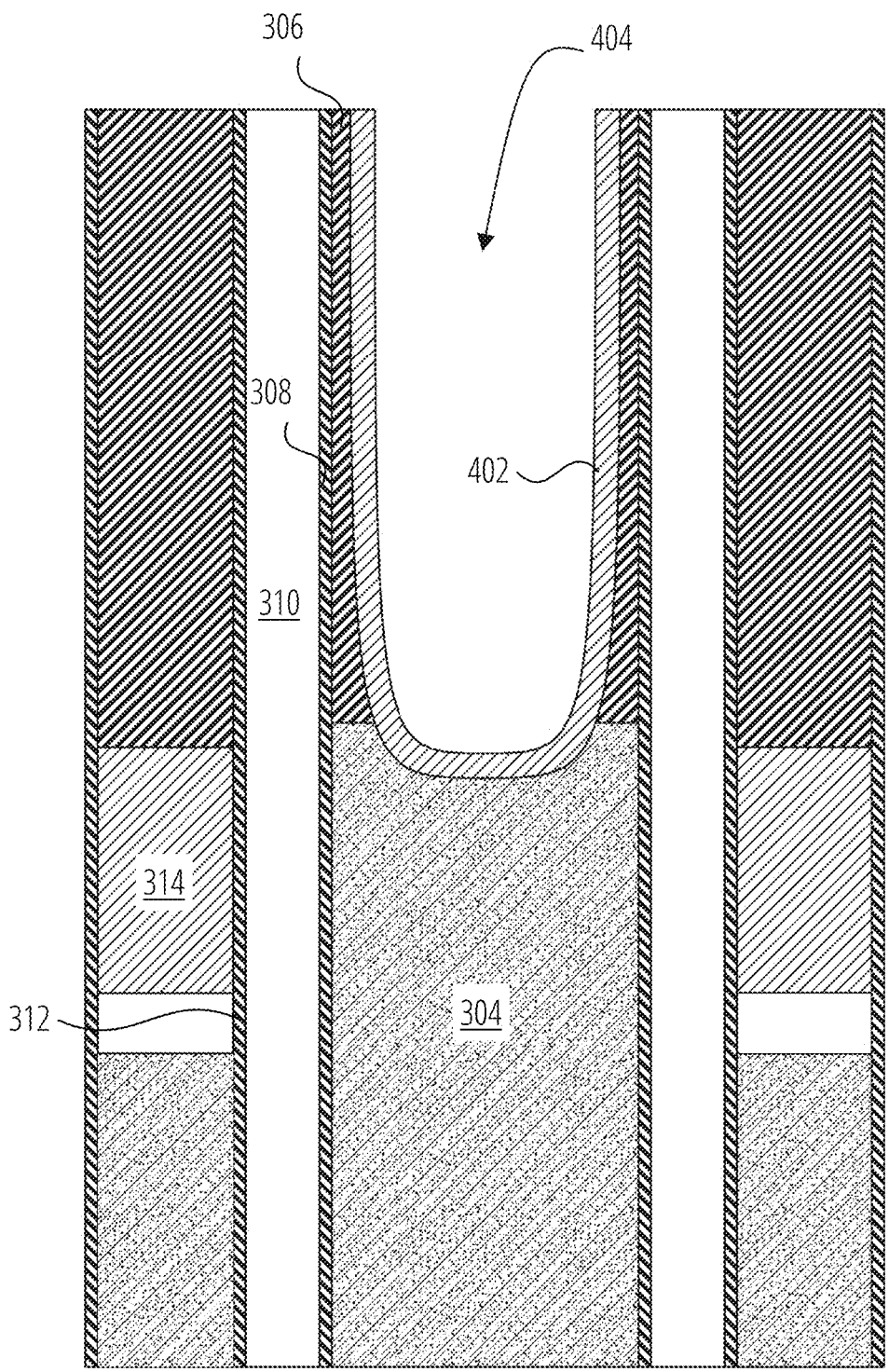

Referring to FIG. 4, without yet cleaning, drying, or otherwise treating the surfaces exposed in the contact opening 302 (FIG. 3), a first metal nitride liner 402 is formed at least along surfaces that were exposed in the contact opening 302, forming a first lined contact opening 404. The first metal nitride liner 402 may have a thickness within a range from about 1.5 nm to about 5 nm. The first metal nitride liner 402 may be formed directly on the surfaces of the dielectric liner 306 and the polysilicon structure 304 that were exposed by the contact opening 302 of FIG. 3. In other words, the first metal nitride liner 402 is formed on at least an untreated surface of the polysilicon structure 304. As used herein, the term "untreated surface" means and includes a surface that, once exposed by a completed material-removal (e.g., etching) act, has not been subsequently exposed to a material-removal act, such as cleaning (e.g., an act configured to remove impurities from a surface), drying (e.g., an act configured to remove moisture), and etching.

The first metal nitride liner 402 is formed of a metal nitride material (e.g., titanium nitride (TiN)), resistant to isotropic etching and capable of functioning as barrier material for the conductive material of the conductive contact structure to be formed.

The first metal nitride liner 402 may be formed by, for example, deposition (e.g., conformal deposition by CVD, ALD) of a metal nitride (e.g., TiN) followed by removal (e.g., by CMP) of material of the first metal nitride liner 402 outside the boundaries of the first lined contact opening 404.

Figure 5:
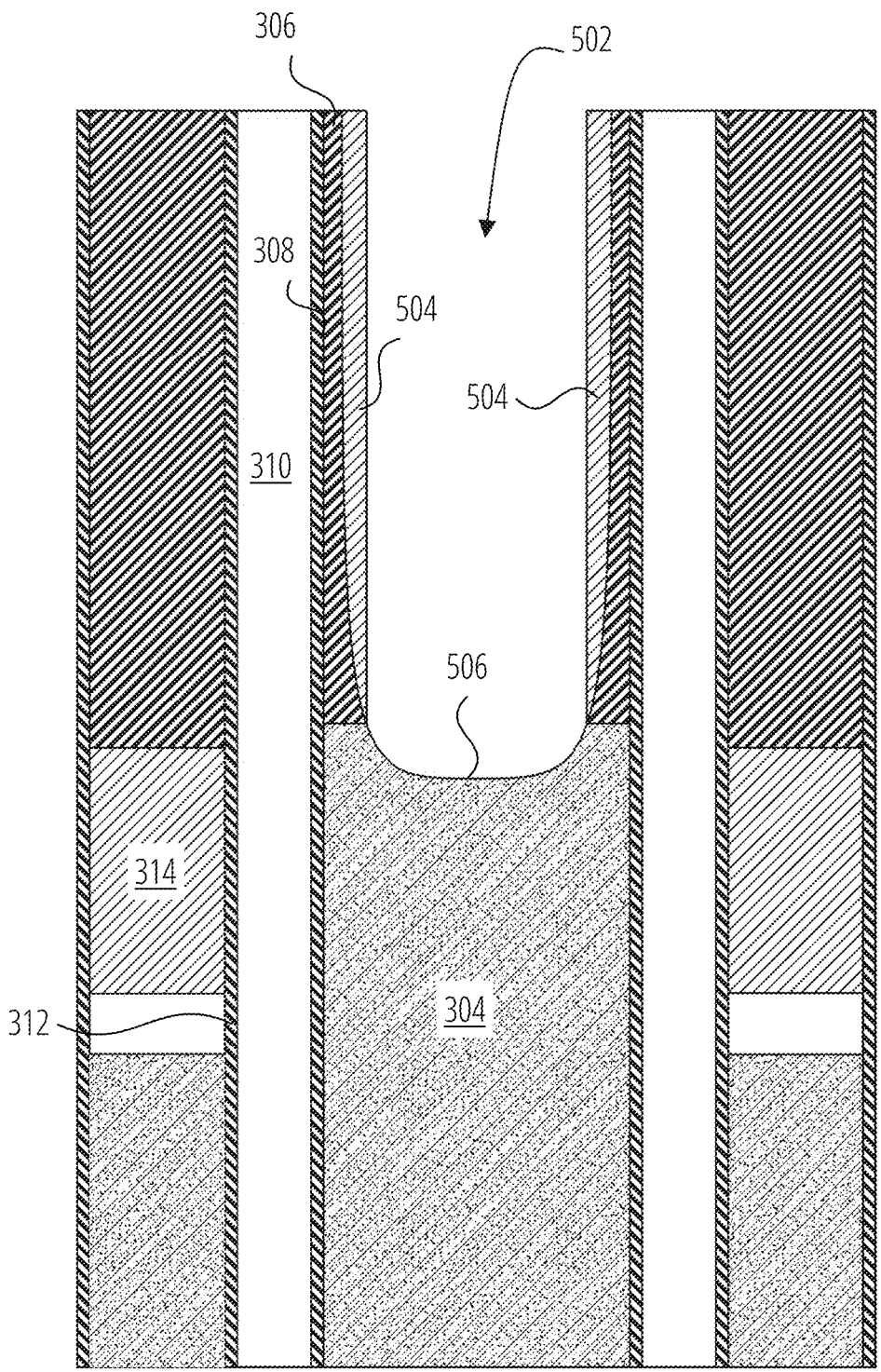
Figure 6:
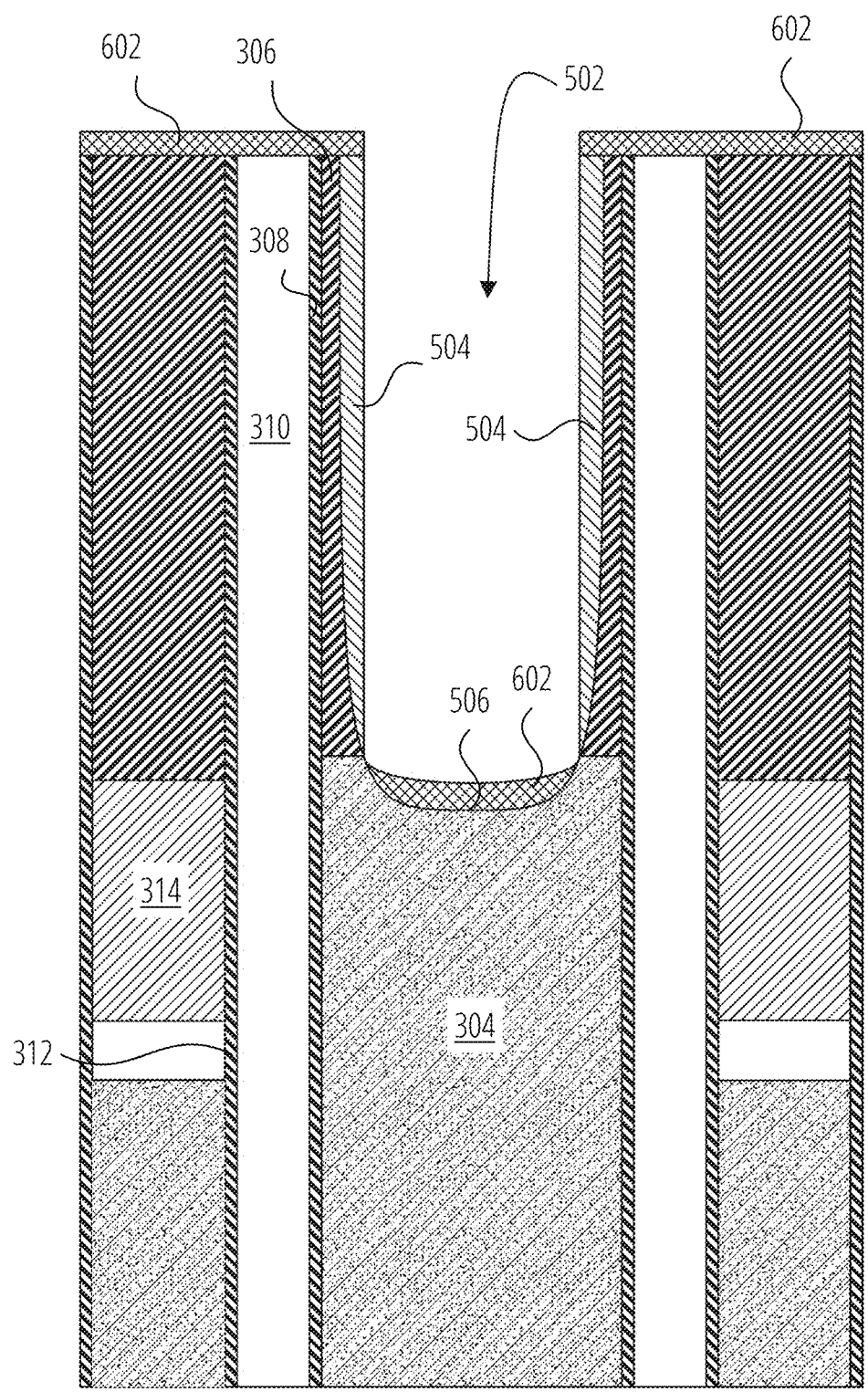

A portion of the first metal nitride liner 402 adjacent the bottom of the first lined contact opening 404 is removed (commonly referred to as "punched through") to form an opening 502, as illustrated in FIG. 5, with a first metal nitride sidewall liner 504 along the lateral sides of the opening 502. A surface portion 506 of the polysilicon structure 304 is exposed at the bottom of the opening 502.

Removing the bottom portion of the first metal nitride liner 402 (FIG. 4) to form the first metal nitride sidewall liner 504 may be accomplished by conventional processes, such as conventional etching processes (e.g., conventional dry etching processes), which are not described in detail herein.

The first metal nitride sidewall liner 504 is disposed between the opening 502 and the dielectric materials that neighbor the opening 502, including the dielectric liner 306, the dielectric structure 308, and the other dielectric structure 310. Each of these dielectric materials may be covered within the opening 502. The first metal nitride sidewall liner 504 therefore is configured to cover and protect the dielectric materials, including the directly adjacent dielectric liner 306, during subsequent fabrication acts.

After forming the first metal nitride sidewall liner 504 along the sidewalls of the opening 502, the exposed surface portion 506 of the polysilicon structure 304 may be cleaned and dried to prepare the surface portion 506 for a metal (e.g., cobalt (Co)) that will eventually be included in a silicide region.

Cleaning may comprise performing isotropic etching, e.g., a vapor etch pretreatment for subsequent metal (e.g., cobalt) sputtering. For example, cleaning may comprise use of dilute hydrofluoric acid (DHF).

Drying may comprise exposing the structure of FIG. 5 to heat. In some embodiments, the drying act may be free of the use of chlorine-based etchants; therefore, the metal nitride (e.g., TiN) of the first metal nitride sidewall liner 504 may not be degraded or removed during the drying.

Due to the presence of the first metal nitride sidewall liner 504 over the dielectric liner 306 and other dielectric materials (e.g., the dielectric structure 308, the other dielectric structure 310) that neighbor the opening 502, the dielectric materials (including the dielectric liner 306) are not exposed to the cleaning and drying processes and so are not threatened with unintentional removal of some or all of the dielectric material. Therefore, the opening 502 is not expanded during the cleaning or the drying. In contrast, conventional methods that conducted the cleaning and drying after forming a contact opening (e.g., the contact opening 302 of FIG. 3) risk removing some or all of the neighboring dielectric material, causing the contact opening to unintentionally expand in width, as discussed above with respect to FIG. 1B, for example.

Moreover, due to the presence of the first metal nitride sidewall liner 504 over the dielectric liner 306 and other dielectric materials, the dielectric liner 306 need not have a great thickness, e.g., prior to the cleaning and drying, to compensate for material loss during, e.g., the cleaning and drying. For example, in some embodiments the dielectric liner 306, after forming the contact opening 302 of FIG. 3, may have a thickness of about 2 nm. At such relatively low thicknesses of the dielectric liner 306, the opening 502 (and, subsequently the conductive contact structure) may be broader than it otherwise may have been had a thick dielectric liner been used (e.g., as in FIG. 1C, discussed above), enabling the conductive contact structure to be formed to have a lower electrical resistance, and therefore an improved performance, than it otherwise may have had.

Still further, because the thickness of the dielectric liner 306 remains the same or substantially the same before and after, e.g., cleaning and drying, the thickness of the dielectric liner 306 may be more precisely tailored and/or controlled to form a conductive contact structure with a more precisely tailored and/or controlled width, in consideration of the width of the opening 502. For example, if the width of the opening 502 is relatively narrow, the thickness of the dielectric liner 306 may be tailored, e.g., before cleaning and drying, to be relatively thin to enable subsequent formation of a conductive contact structure of a desired, sufficient width within the relatively-narrow opening. On the other hand, if the width of the opening 502 is relatively broad, the thickness of the dielectric liner 306 may be tailored, e.g., before cleaning and drying, to be relatively thick to enable subsequent formation of the conductive contact structure of the desired, sufficient width within the relatively-broad opening. Therefore, the protection of the dielectric liner 306 by the first metal nitride sidewall liner 504 during, e.g., the cleaning and drying, may enable more precise tailoring and/or control of the formation of the conductive contact structure, as compared to conventional fabrication processes.

After the cleaning and the drying, a metal 602 (to eventually be included in a metal silicide) is formed (e.g., by sputtering) on at least the surface portion 506 of the polysilicon structure 304 at the base of the opening 502. The metal 602 may also form on upper surfaces of the intermediate structure, e.g., on upper surfaces of the dielectric liner 306, the dielectric structure 308, and the other dielectric structure 310. Vertical surfaces of the first metal nitride sidewall liner 504 may be substantially free of the metal 602.

By way of non-limited example, the metal 602 may comprise one or more of cobalt (Co), titanium (Ti), tungsten (W), tantalum (Ta), molybdenum (Mo), platinum (Pt), ruthenium (Ru), and nickel (Ni).

Figure 7:
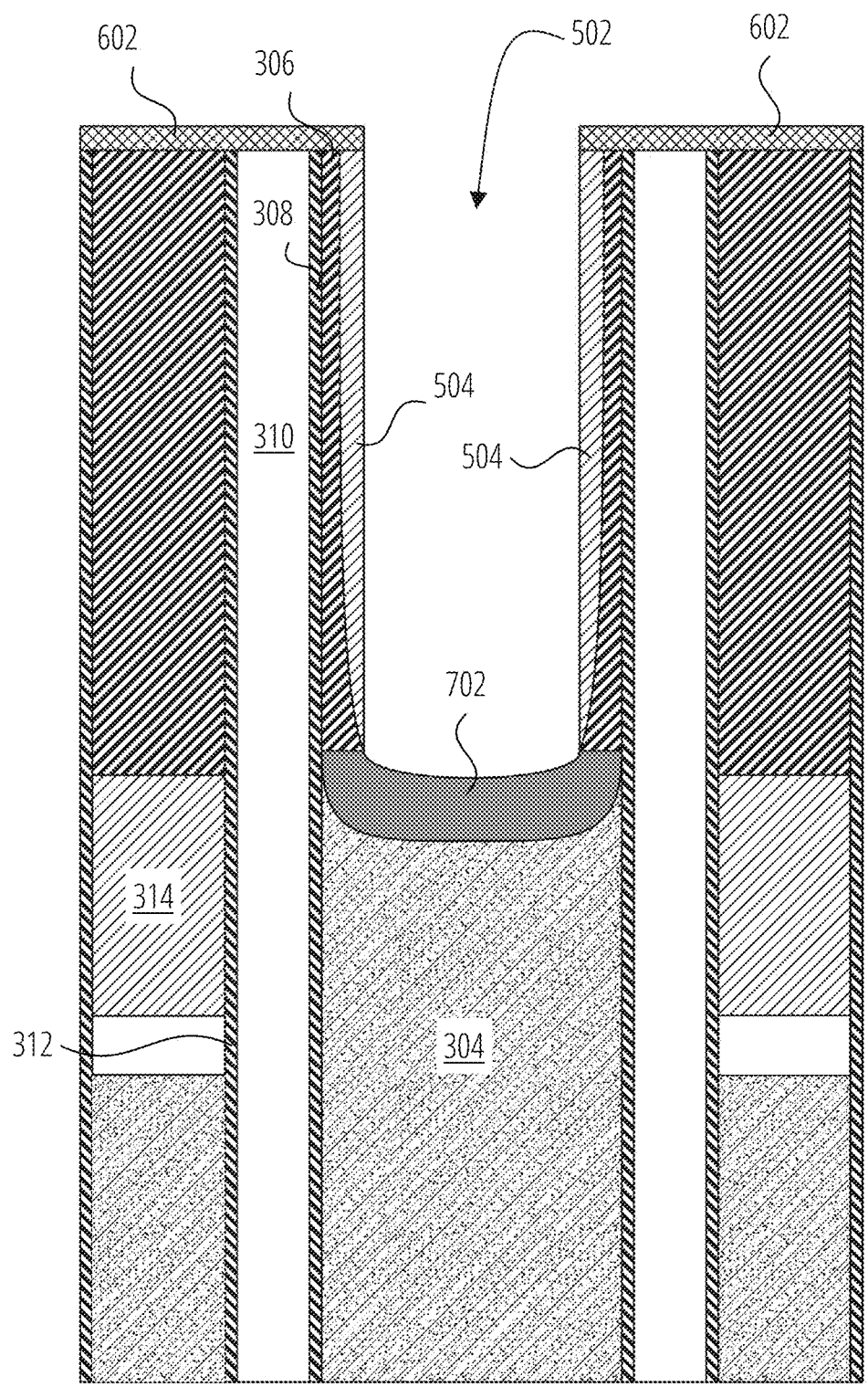

Exposing the metal 602 that is along the surface portion 506 of the polysilicon structure 304 to, e.g., rapid thermal processing (RTP) causes the metal 602 to react with the polysilicon structure 304 at the surface portion 506 to form a metal silicide, as illustrated in FIG. 7. A silicide region 702 is therefore formed at the bottom of the opening 502 to at least partially (e.g., substantially) cover polysilicon structure 304. The silicide region 702 may be formed to exhibit any desirable height (e.g., vertical thickness), and the silicide region 702 may span at least a width (e.g., a whole width) of the opening 502. In some embodiments, the silicide region 702 may span a whole width of the polysilicon structure 304. For example, the silicide region 702 may extend across a whole width of the opening 502 as well as, e.g., under the first metal nitride sidewall liner 504 and under the dielectric liner 306. Vertical surfaces of the first metal nitride sidewall liner 504 may be substantially free of the metal silicide of the silicide region 702.

Depending on the composition of the metal 602, the metal silicide of the silicide region 702 may include or be formed of one or more of cobalt silicide (CoSi$_x$), titanium silicide (TiSi$_x$), tungsten silicide (WSi$_x$), tantalum silicide (TaSi$_x$), molybdenum silicide (MoSi$_x$), platinum silicide (PtSi$_x$), ruthenium silicide (RuSi$_x$), and nickel silicide (NiSi$_x$).

Figure 8:
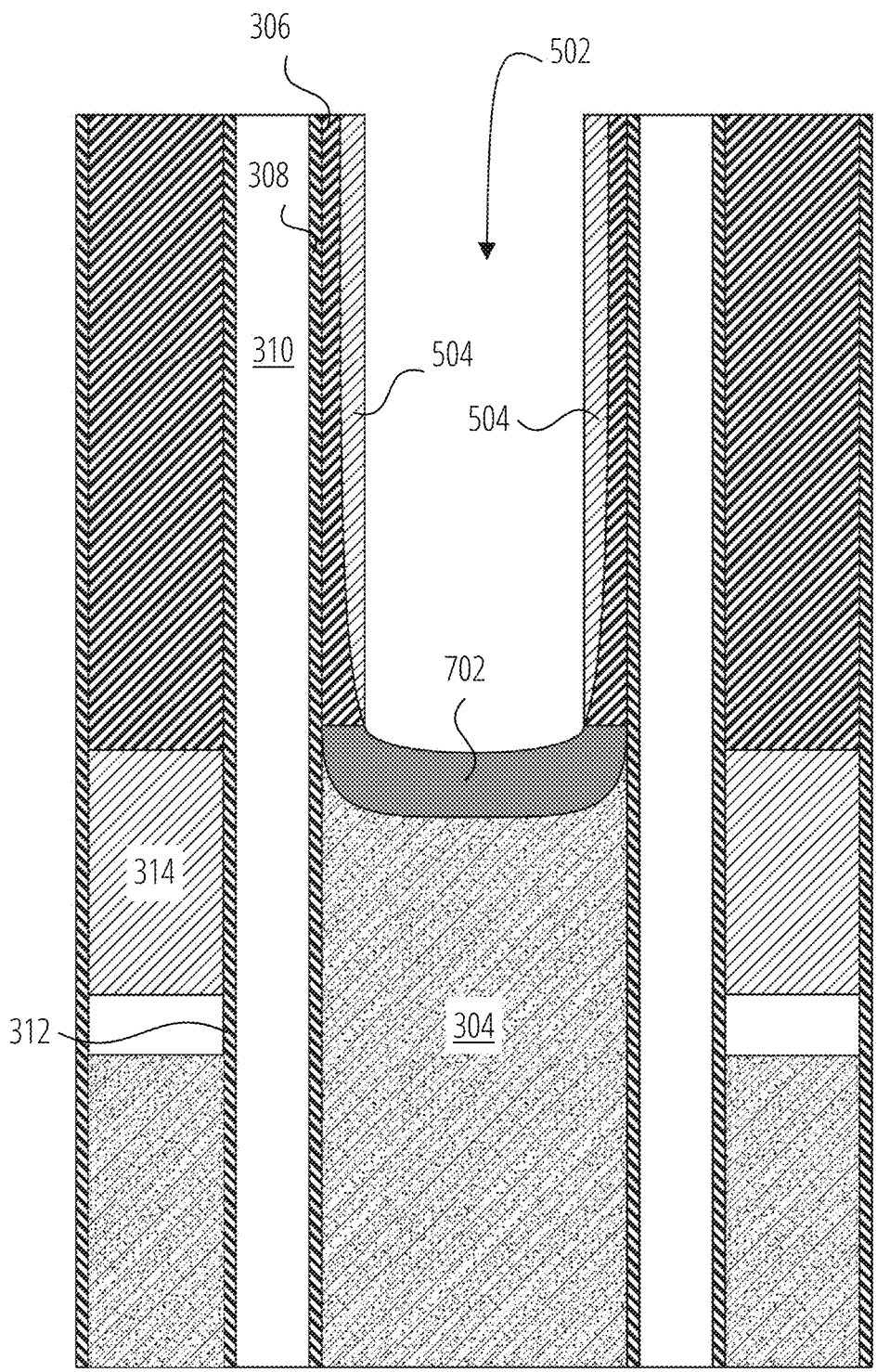

Portions of the metal 602 that were not converted into the metal silicide of the silicide region 702 (hereinafter "remnant portions" of the metal 602) are then removed, e.g., from the upper surfaces of the structure, including from the upper surface of the first metal nitride sidewall liner 504, the dielectric liner 306, the dielectric structure 308, and the other dielectric structure 310, as illustrated in FIG. 8.

The remnant portions of the metal 602 (FIG. 6) may be removed by, e.g., etching (e.g., a wet strip) followed by a cleaning act (e.g., with DHF).

Because the first metal nitride sidewall liner 504 are in place during this remnant-removal process, the neighboring dielectric materials (e.g., the dielectric liner 306, the dielectric structure 308, and the other dielectric structure 310) are protected against removal; therefore, unintentional contact expansion is again avoid, unlike the hypothetical embodiment discussed above with respect to FIG. 1B.

Figure 9:
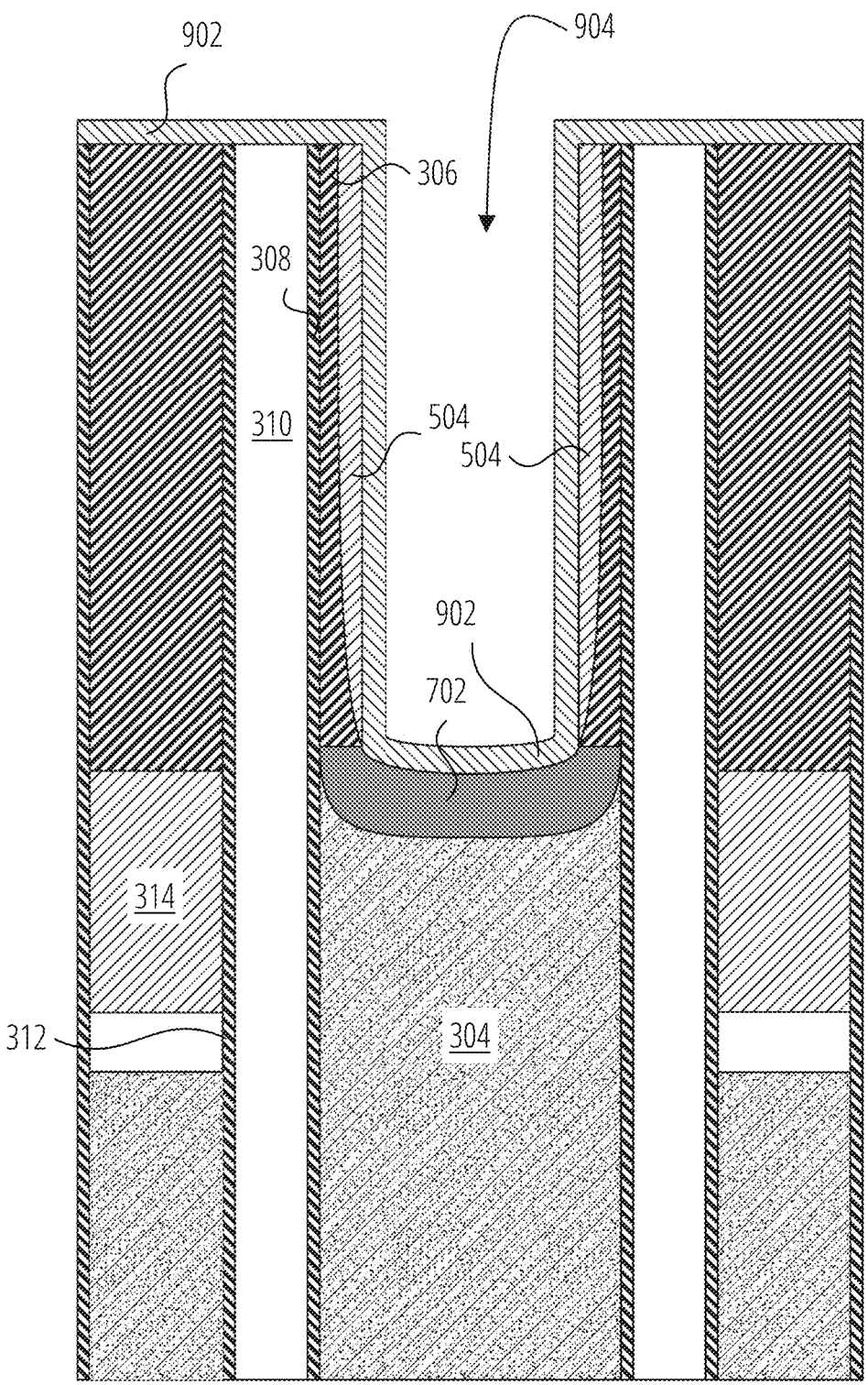

With reference to FIG. 9, a second metal nitride liner 902 is then formed (e.g., conformally formed) on all exposed surfaces, including on the first metal nitride sidewall liner 504 and the silicide region 702. A second metal nitride lined opening 904 therefore is wholly defined by the second metal nitride liner 902.

Because of the earlier removal of a portion of the first metal nitride liner 402 (FIG. 4) when forming the first metal nitride sidewall liner 504, the second metal nitride liner 902 is formed in direct contact with the silicide region 702.

The second metal nitride liner 902 may be formed by, e.g., CVD of a metal (e.g., Ti) along with nitridization to conformally form the metal nitride material as the second metal nitride liner 902. The second metal nitride liner 902 adjacent the silicide region 702 may also getter oxygen. That is, prior to formation of the second metal nitride liner 902, a native oxygen may have formed on the surface of the silicide region 702 that was exposed in opening 502 (FIG. 5). In some embodiments, a cleaning process may be performed to remove the native oxygen, prior to forming the second metal nitride liner 902. Even so, a residual amount of the oxygen may remain, and, in such circumstances, forming the metal, of the second metal nitride liner 902, on the surface containing residual oxygen may cause the metal to getter (e.g., absorb) the residual oxygen. A thin metal oxide may, as a result, be formed along the upper surface of the silicide region 702, with the second metal nitride liner 902 above. The presence of the metal oxide may inhibit nitridization of the metal silicide of the silicide region 702 during nitridization of the metal, of the second metal nitride liner 902, for forming the metal nitride material thereof. In such embodiments, the presence of a thin amount of metal oxide between the metal silicide (of the silicide region 702) and the metal nitride (of the second metal nitride liner 902) may nonetheless exhibit a lower electrical resistance than compared to a structure including an extensive insulating liner (e.g., an oxide film) on such a silicide region 702.

Figure 10:
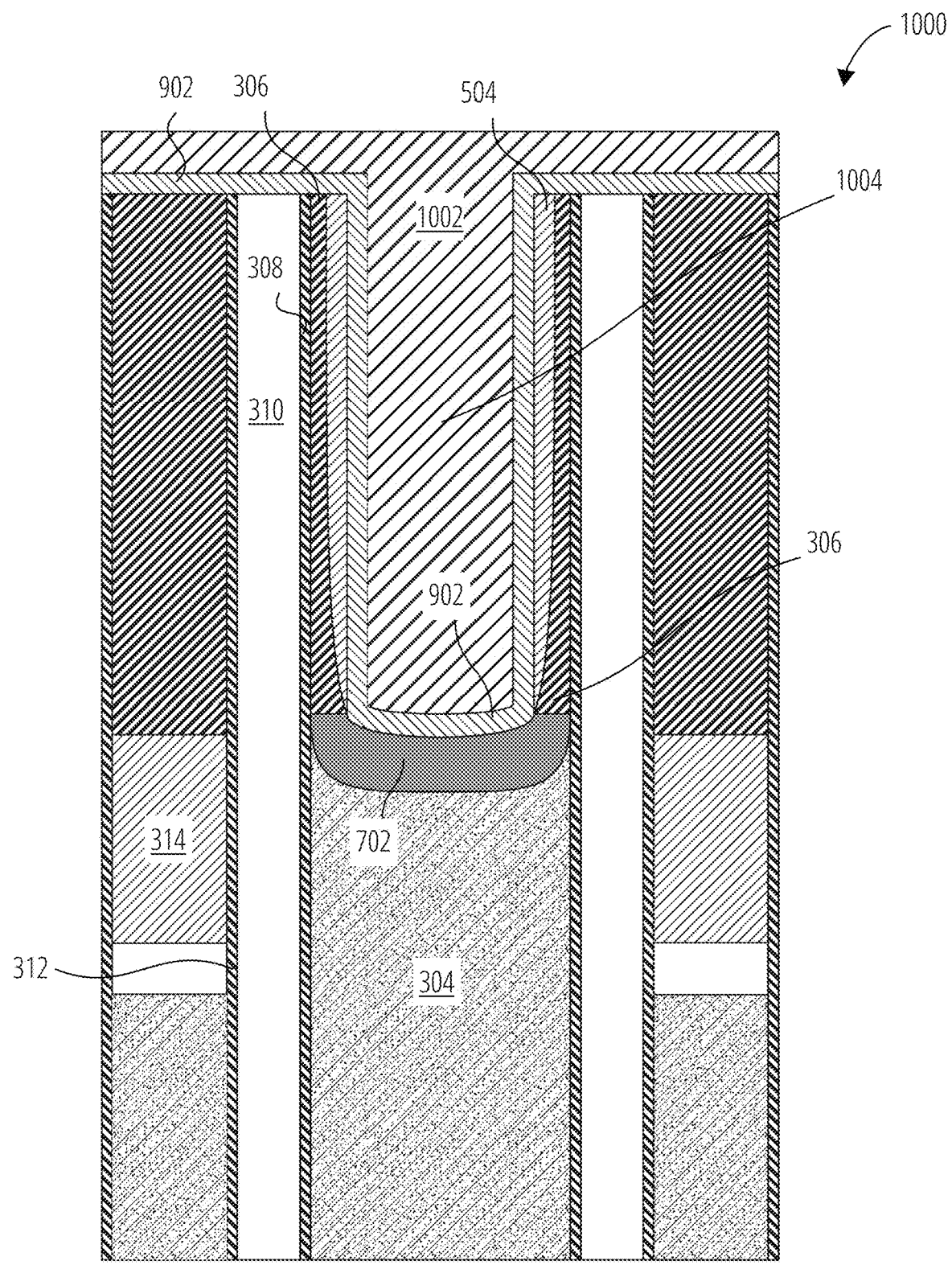

With reference to FIG. 10, a conductive material 1002 is then formed to fill the second metal nitride lined opening 904 of FIG. 9, forming a microelectronic device structure 1000 with a conductive contact structure 1004. Though not illustrated, in subsequent processing, the microelectronic device structure 1000 may be subjected to, e.g., planarization or other material-removal acts to electrically isolate the conductive contact structure 1004 from neighboring conductive contact structures (e.g., additional ones of the conductive contact structure 1004) that may have been simultaneously formed from the conductive material 1002.

The conductive material 1002 may be formed of or include at least one electrically conductive material, such as one or more of a metal, an alloy, a conductive metal oxide, a conductive metal nitride, a conductive metal silicide, and a conductively-doped semiconductor material. By way of non-limiting example, the conductive material 1002 may be formed of and include one or more of tungsten (W), tungsten nitride (WN$_y$), nickel (Ni), tantalum (Ta), tantalum nitride (TaN$_y$), tantalum silicide (TaSi$_x$), platinum (Pt), copper (Cu), cobalt (Co), silver (Ag), gold (Au), aluminum (Al), molybdenum (Mo), titanium (Ti), titanium nitride (TiN$_y$), titanium silicide (TiSi$_x$), titanium silicon nitride (TiSi$_x$N$_y$), titanium aluminum nitride (TiAl$_x$N$_y$), molybdenum nitride (MoN$_x$), iridium (Ir), iridium oxide (IrO$_z$), ruthenium (Ru), ruthenium oxide (RuO$_z$), and conductively doped silicon. In some embodiments, the conductive material 1002 is formed of and includes tungsten (W).

The presence of the first metal nitride sidewall liner 504 and the second metal nitride liner 902 also protects the neighboring dielectric materials (e.g., the dielectric liner 306, etc.) from damage during use of film-forming gases, such as tungsten hexafluoride (WF$_6$) in embodiments in which the conductive material 1002 is formed of tungsten (W).

The second metal nitride liner 902, being between (e.g., directly between) the conductive material 1002 and the silicide region 702, may function as a barrier material, inhibiting atoms of the conductive material 1002 from traversing into the silicide region 702.

Due to the earlier removal of lower portions of the first metal nitride liner 402 (FIG. 4) to form the first metal nitride sidewall liner 504, only one metal nitride liner, namely the second metal nitride liner 902, is between the conductive material 1002 and the silicide region 702. In contrast, the hypothetical embodiments described above with respect to FIG. 1A to FIG. 1C included multiple metal nitride liners (e.g., the first metal nitride liner 108 and the second metal nitride liner 110) between the silicide region 106 and the conductive contact structure 102. Therefore, the conductive material 1002 and the silicide region 702 may be closer to one another than according to the hypothetical embodiments of FIG. 1A to FIG. 1C, which may enable greater electrical communication between the conductive material 1002 and the silicide region 702. The use of only one metal nitride liner (e.g., the second metal nitride liner 902) between the conductive material 1002 and the silicide region 702 is enabled at least because the metal nitride liner may also function as a barrier material.

Accordingly, disclosed is a method of forming a microelectronic device. The method comprises forming an opening through at least one dielectric material to expose a surface of a polysilicon structure. A first metal nitride liner is formed in the opening. After forming the first metal nitride liner, the surface of the polysilicon structure is cleaned and dried. A metal silicide region is formed at the surface of the polysilicon structure. A second metal nitride liner is formed on the first metal nitride liner and on the metal silicide region. A remaining portion of the opening, overlying the second metal nitride liner, is filled with a conductive material to form a conductive contact structure.

Also, disclosed is a microelectronic device comprising at least one conductive contact structure over a metal silicide material. A first metal nitride liner is on vertical sidewalls of the at least one conductive contact structure. A second metal nitride liner is between the conductive contact structure and the metal silicide material.

The methods of the disclosure may also be used to form other conductive contact structures, such as peripheral contact structures, as illustrated in FIGS. 11 through 18.

Figure 11:
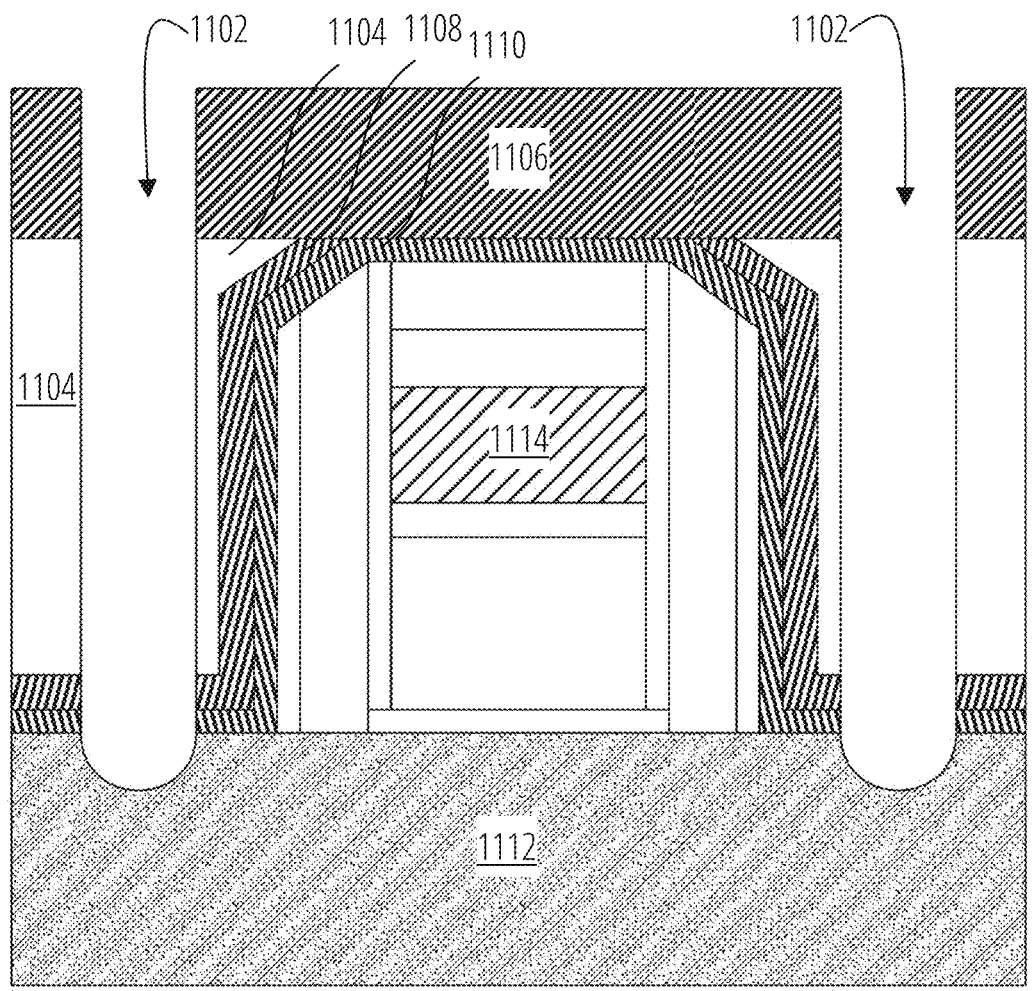
FIG. 11 through FIG. 18 are cross-sectional, elevational, schematic illustrations during various stages of processing to fabricate a microelectronic device structure, illustrated in FIG. 18, with peripheral contact structures, according to embodiments of the disclosure.
Figure 12:
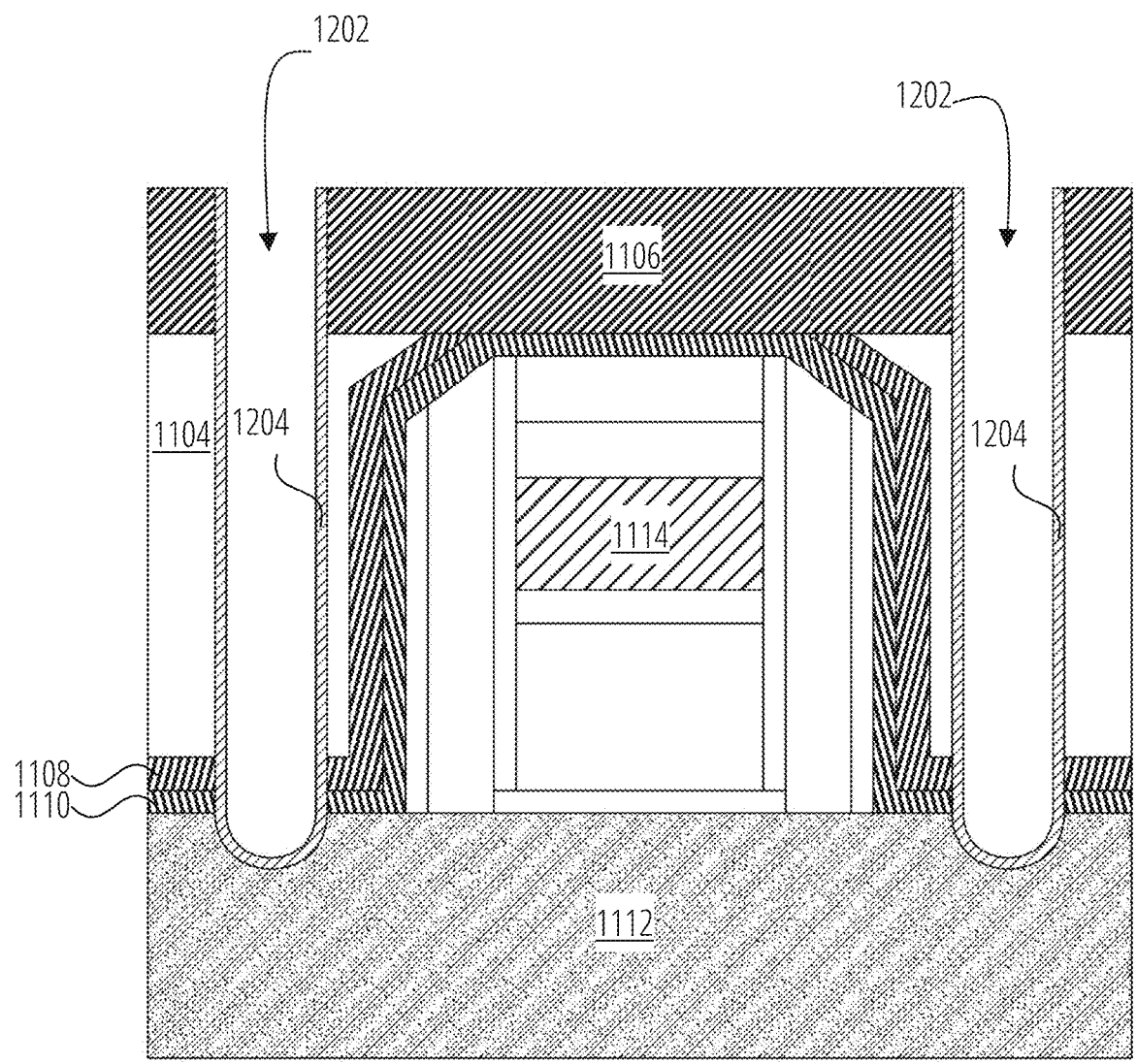

With reference to FIG. 11, contact openings 1102 are formed (e.g., etched) through at least one dielectric material, such as a dielectric fill structure 1104 (e.g., formed of or including Sift), an upper dielectric structure 1106 (e.g., formed of or including SiN), another dielectric structure 1108 (e.g., formed of or including $SiO_2$), and an additional dielectric structure 1110 (e.g., formed of or including SiN) to expose surfaces of a polysilicon structure 1112. The contact openings 1102 may be formed on either side of an already-formed structure comprising a conductive region, e.g., gate 1114. The dielectric fill structure 1104, the other dielectric structure 1108, and the additional dielectric structure 1110 may be between the contact openings 1102 and the gate 1114.

Without yet treating (e.g., cleaning, drying) the surfaces exposed in the contact openings 1102, a first metal nitride liner 1204 is formed (e.g., in the same manner described above with respect to forming the first metal nitride liner 402 of FIG. 4) on at least the surfaces defining the contact openings 1102, forming first lined contact openings 1202. The first metal nitride liner 1204 is in direct physical contact with the polysilicon structure 1112 as well as the dielectric fill structure 1104, the upper dielectric structure 1106, the other dielectric structure 1108, and the additional dielectric structure 1110.

Figure 13:
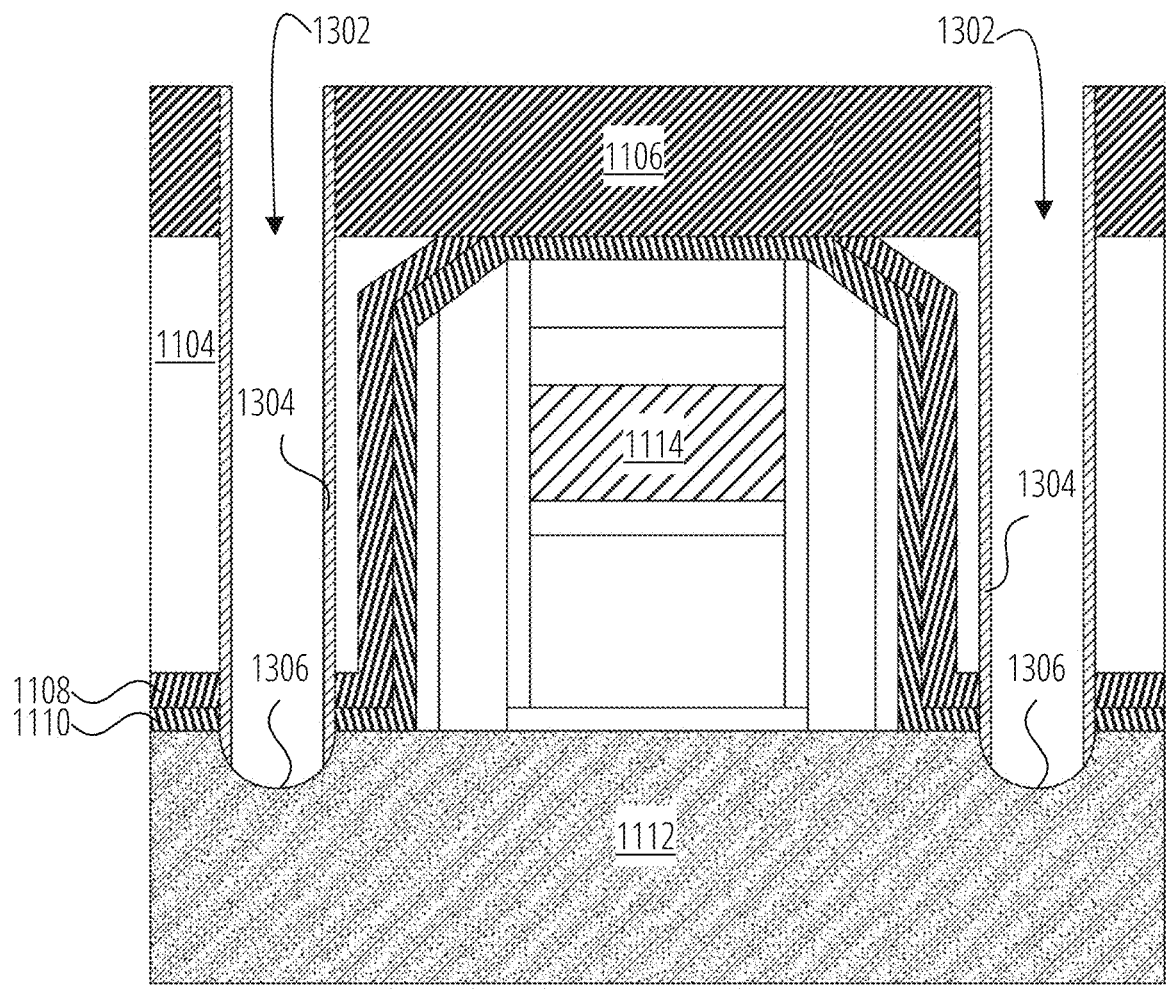

From each of the first lined contact openings 1202, a portion of the first metal nitride liner 1204 is removed (e.g., in the same manner described above with respect to forming the first metal nitride sidewall liner 504 of FIG. 5) to form openings 1302, as illustrated in FIG. 13, with a first metal nitride sidewall liner 1304 along the lateral sides of each of the openings 1302. A surface portion 1306 of the polysilicon structure 1112 is therefore exposed within each of the openings 1302.

Figure 2A:
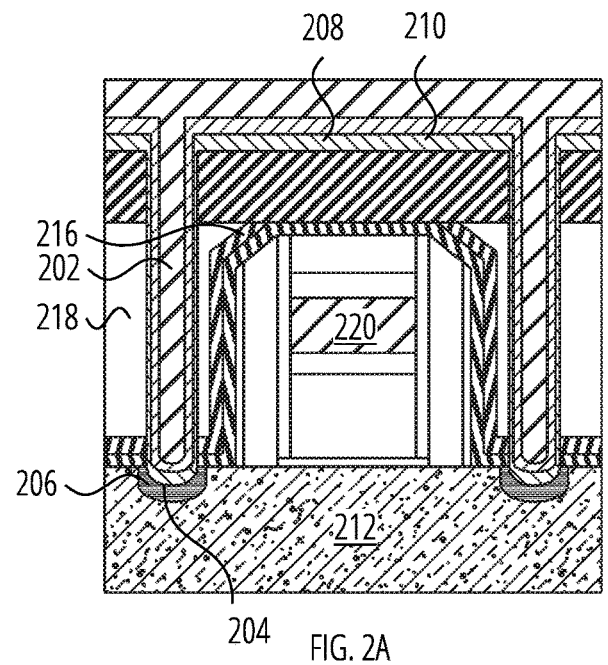
Figure 2B:
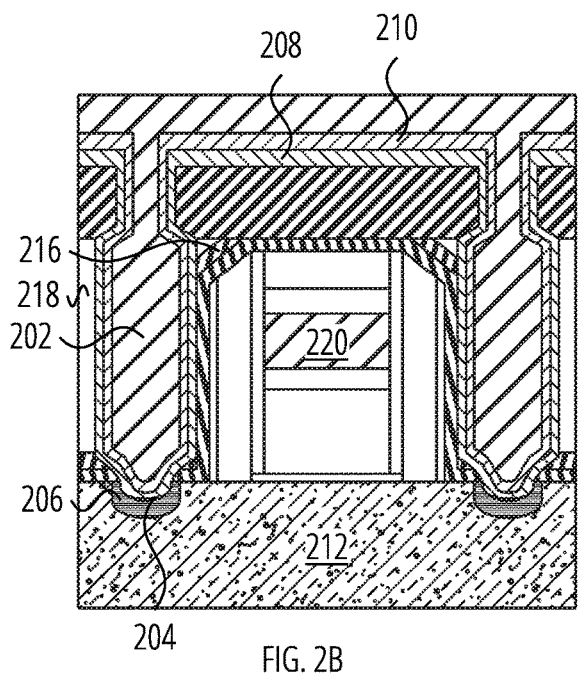

With the first metal nitride sidewall liner 1304 in place, the neighboring dielectric materials (e.g., of the dielectric fill structure 1104, the upper dielectric structure 1106, the other dielectric structure 1108, and the additional dielectric structure 1110) are covered and not exposed in the openings 1302. Cleaning and drying are carried out (e.g., in the same manner described above with respect to FIG. 5), during which the first metal nitride sidewall liner 1304 prevents removal of the neighboring dielectric materials and, therefore, unintentional contact expansion like that discussed above with respect to FIG. 2B.

Figure 2C:
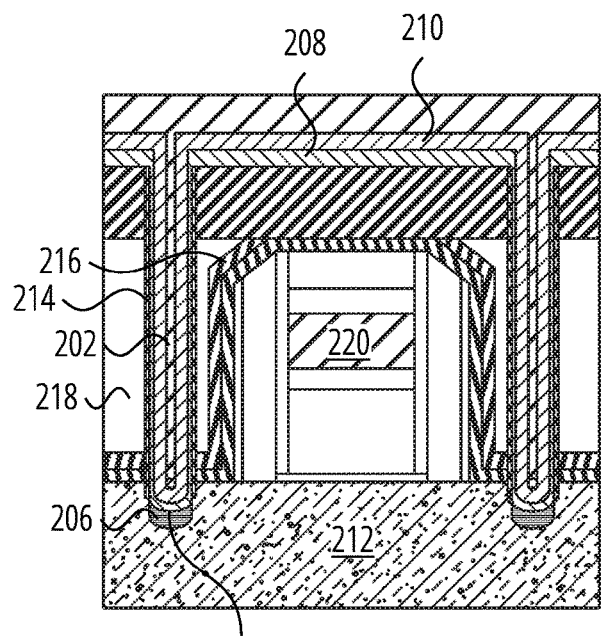

Unlike the hypothetical embodiment of FIG. 2C, discussed above, the method that includes FIG. 13 may not include an additional dielectric liner (e.g., of SiN) between the first metal nitride sidewall liner 1304 and the dielectric fill structure 1104. Therefore, the risk of contact reduction, as discussed above with respect to FIG. 2C, is avoided.

Figure 14:
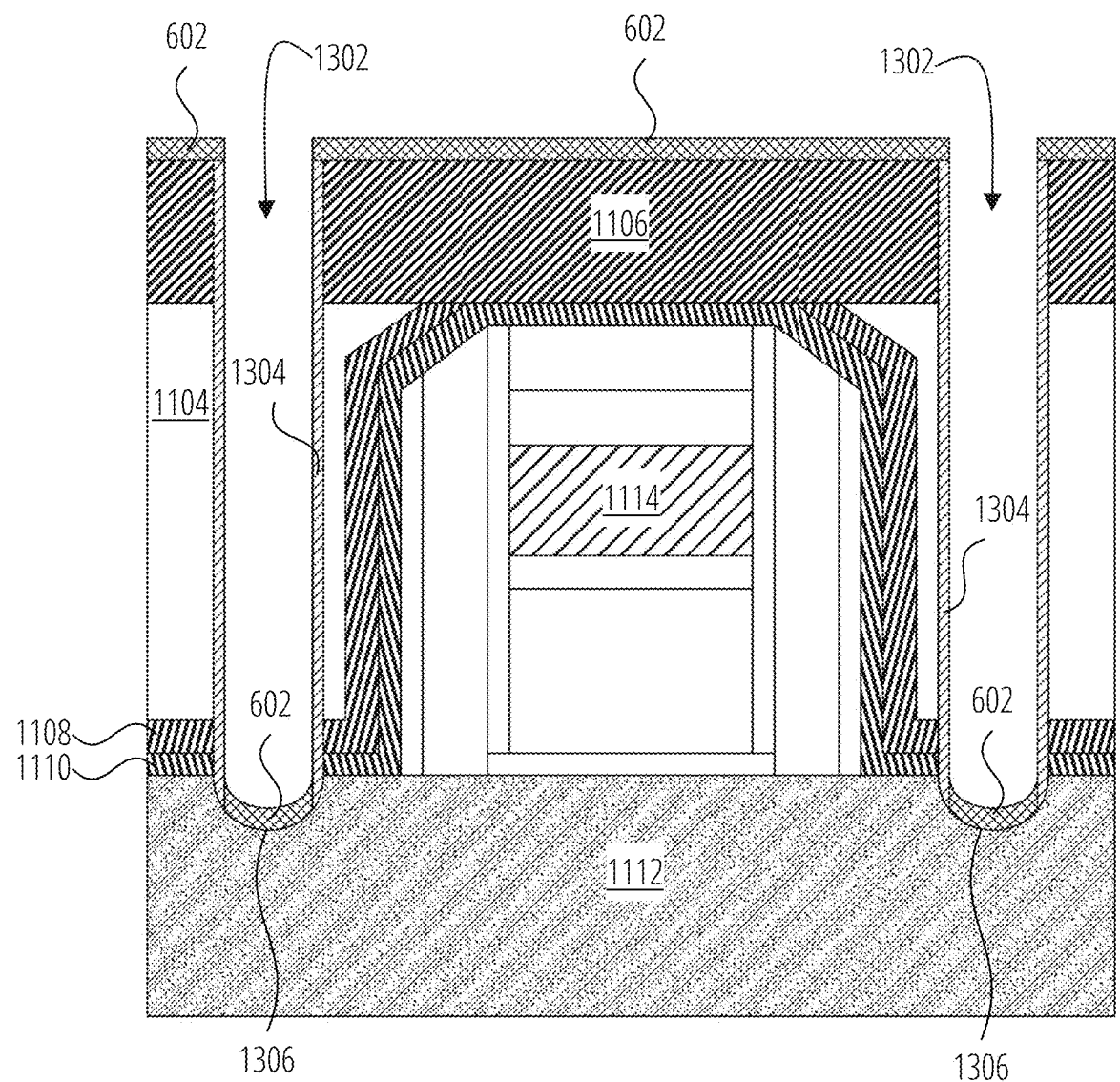

After the cleaning and the drying, the metal 602 for the metal silicide is formed, as illustrated in FIG. 14, e.g., in the same manner described above with respect to FIG. 6.

Figure 15:
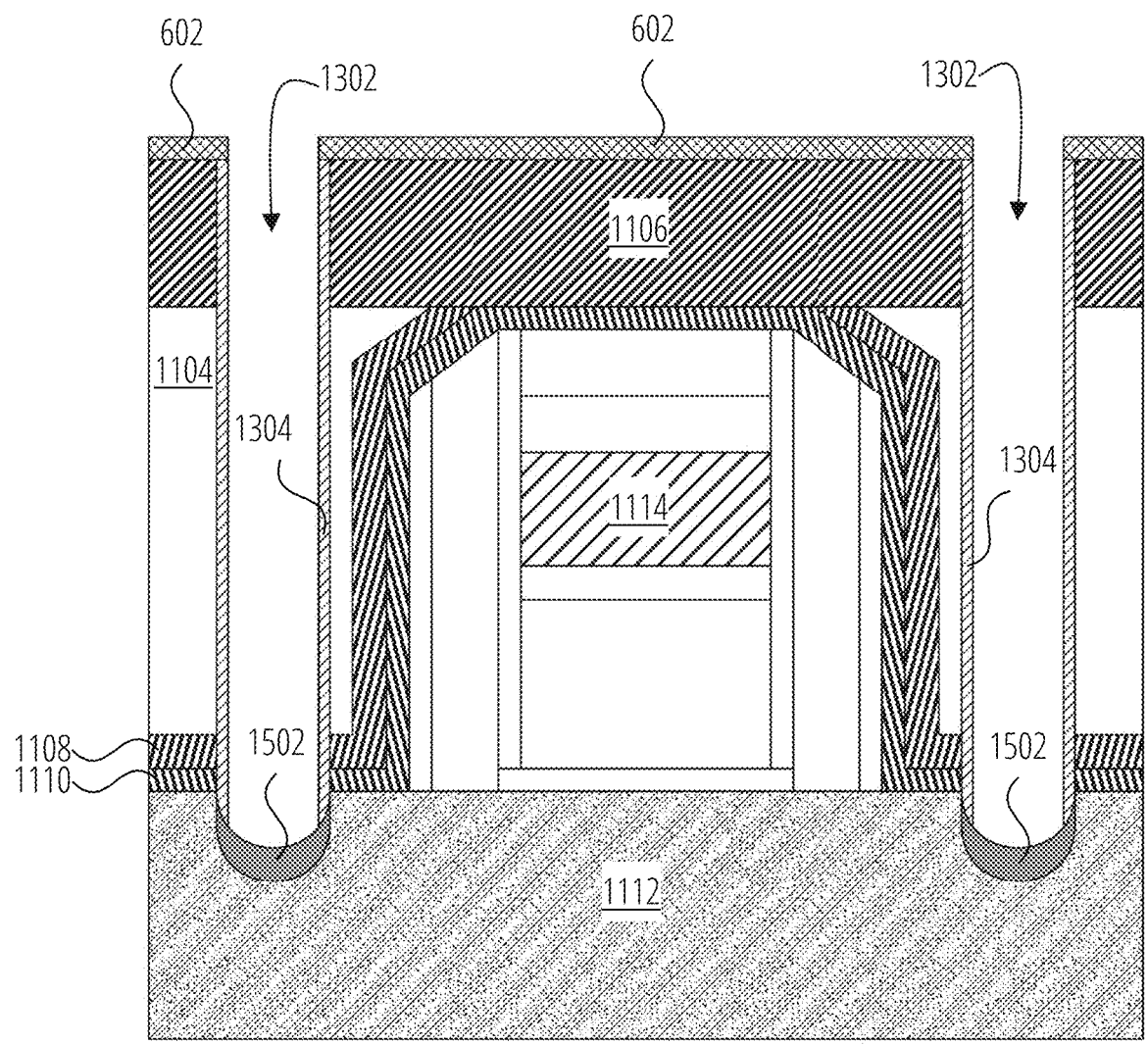

The metal 602 contacting the polysilicon structure 1112 is converted into a metal silicide, e.g., the same manner described above with respect to FIG. 7, forming a silicide region 1502 in each of the openings 1302, as illustrated in FIG. 15. The silicide region 1502 may have at least a width (e.g., a whole width) of each of the openings 1302. The metal silicide of the silicide region 1502 may extend under the first metal nitride sidewall liner 1304, as well.

Remnant portions of the metal 602, e.g., on the upper dielectric structure 1106 and upper surface of the first metal nitride sidewall liner 1304, are then removed, in the same manner described above with respect to FIG. 8. With the first metal nitride sidewall liner 1304 in place during the remnant-removal act, the neighboring dielectric materials (e.g., the dielectric fill structure 1104, the upper dielectric structure 1106, the other dielectric structure 1108, and the additional dielectric structure 1110) are protected against removal, again avoiding the risk of unintentional contact expansion, unlike the hypothetical embodiment described above with respect to FIG. 2B.

Figure 16:
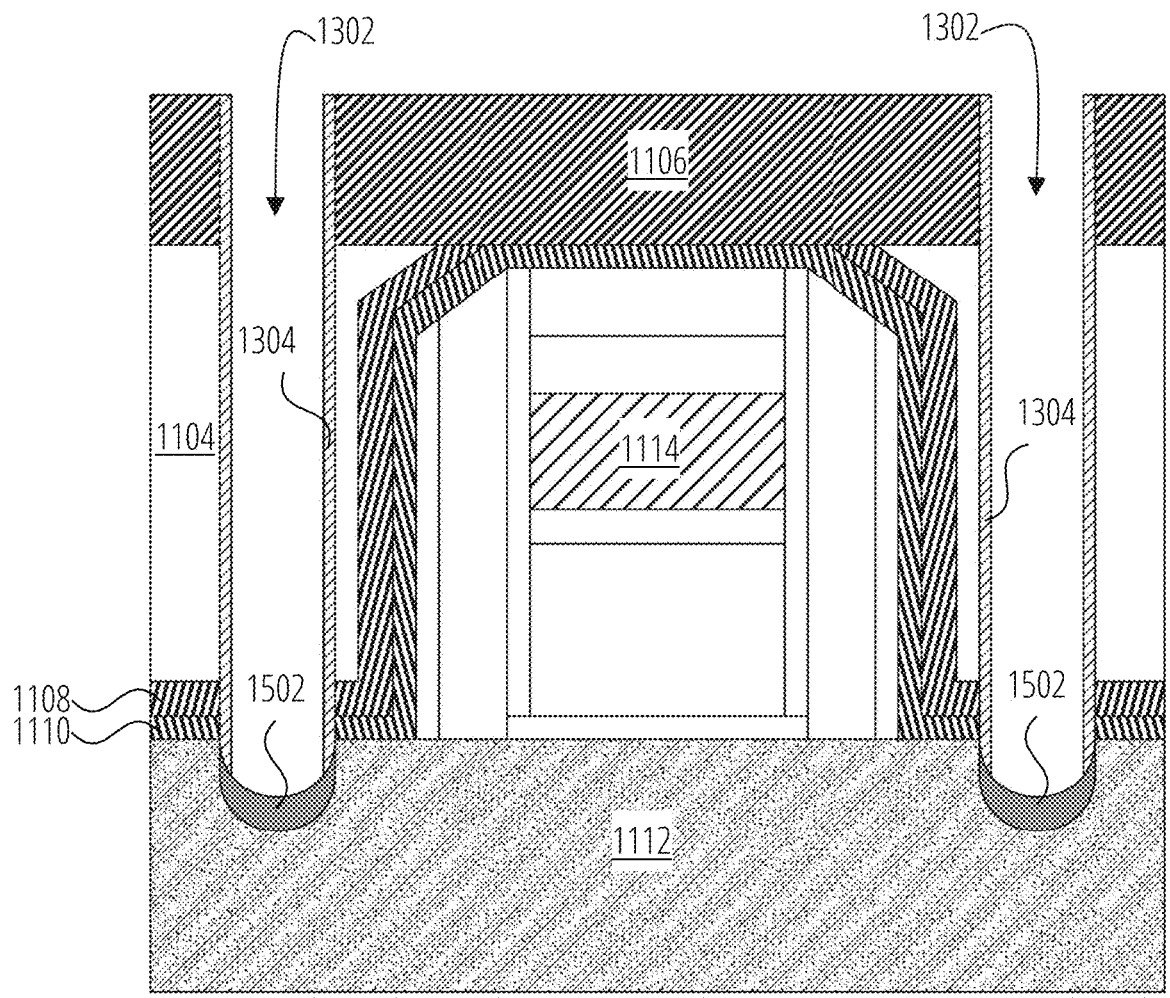
Figure 17:
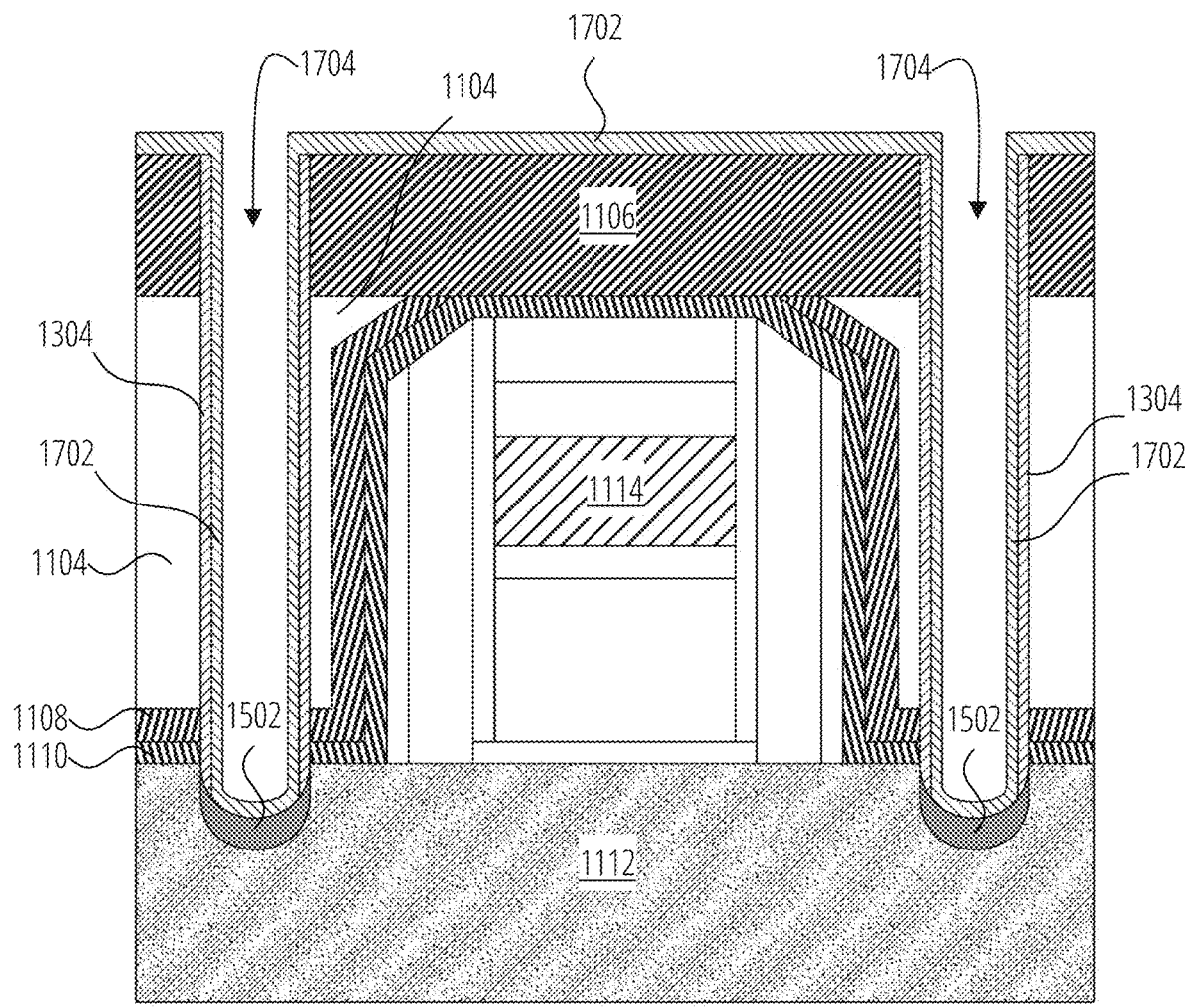

Within the openings 1302 and, optionally, other exposed surfaces of the structure of FIG. 16, a second metal nitride liner 1702 is formed as illustrated in FIG. 17. The second metal nitride liner 1702 may be formed, e.g., in the same manner described above with respect to the second metal nitride liner 902 of FIG. 9. The second metal nitride liner 1702 is in direct contact with the silicide region 1502, and second metal nitride lined openings 1704 are wholly defined by the second metal nitride liner 1702.

Figure 18:
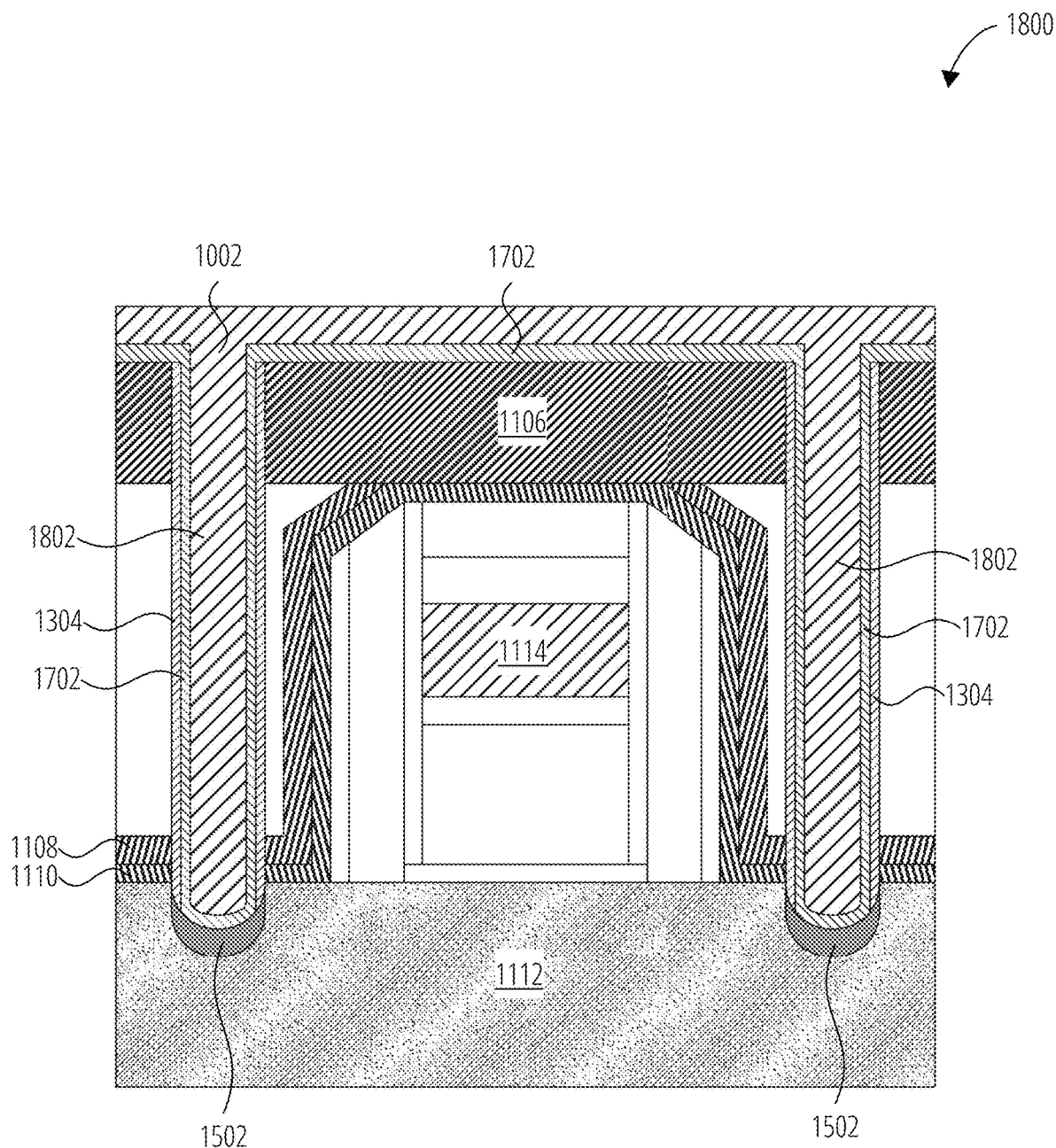

With reference to FIG. 18, the conductive material 1002 is then formed to fill each of the second metal nitride lined openings 1704 of FIG. 17 and form conductive contact structures 1802 (e.g., peripheral contact structures), e.g., in the same manner described above with respect to FIG. 10. Though not illustrated, subsequent processing may include planarization to electrically isolate each of the conductive contact structures 1802 from one another.

The second metal nitride liner 1702, being between (e.g., directly between) the silicide region 1502 and the conductive material 1002 of the conductive contact structures 1802, may function as a barrier material, inhibiting atoms of the conductive material 1002 from traversing into the silicide region 1502.

The microelectronic device structure 1800 of FIG. 18 includes only one metal nitride liner (e.g., the second metal nitride liner 1702) disposed between the silicide region 1502 and the conductive contact structures 1802.

Accordingly, disclosed is a method of forming a microelectronic device. The method comprises forming a contact opening through at least one dielectric material to expose a surface portion of a polysilicon structure. A first metal nitride liner is formed in the contact opening without cleaning and without drying the surface portion of the polysilicon structure. A portion of the first metal nitride liner is removed to re-expose the surface portion of the polysilicon structure. The surface portion of the polysilicon structure is cleaned and dried, and a silicide region is formed at the surface portion of the polysilicon structure. A second metal nitride liner is formed on the silicide region, and a conductive contact structure is formed on the second metal nitride liner.

Also disclosed is a microelectronic device comprising a conductive contact structure laterally adjacent an electrically insulated conductive region. A silicide region is under the conductive contact structure. A single metal nitride liner is directly between the silicide region and the conductive contact structure.

Figure 19:
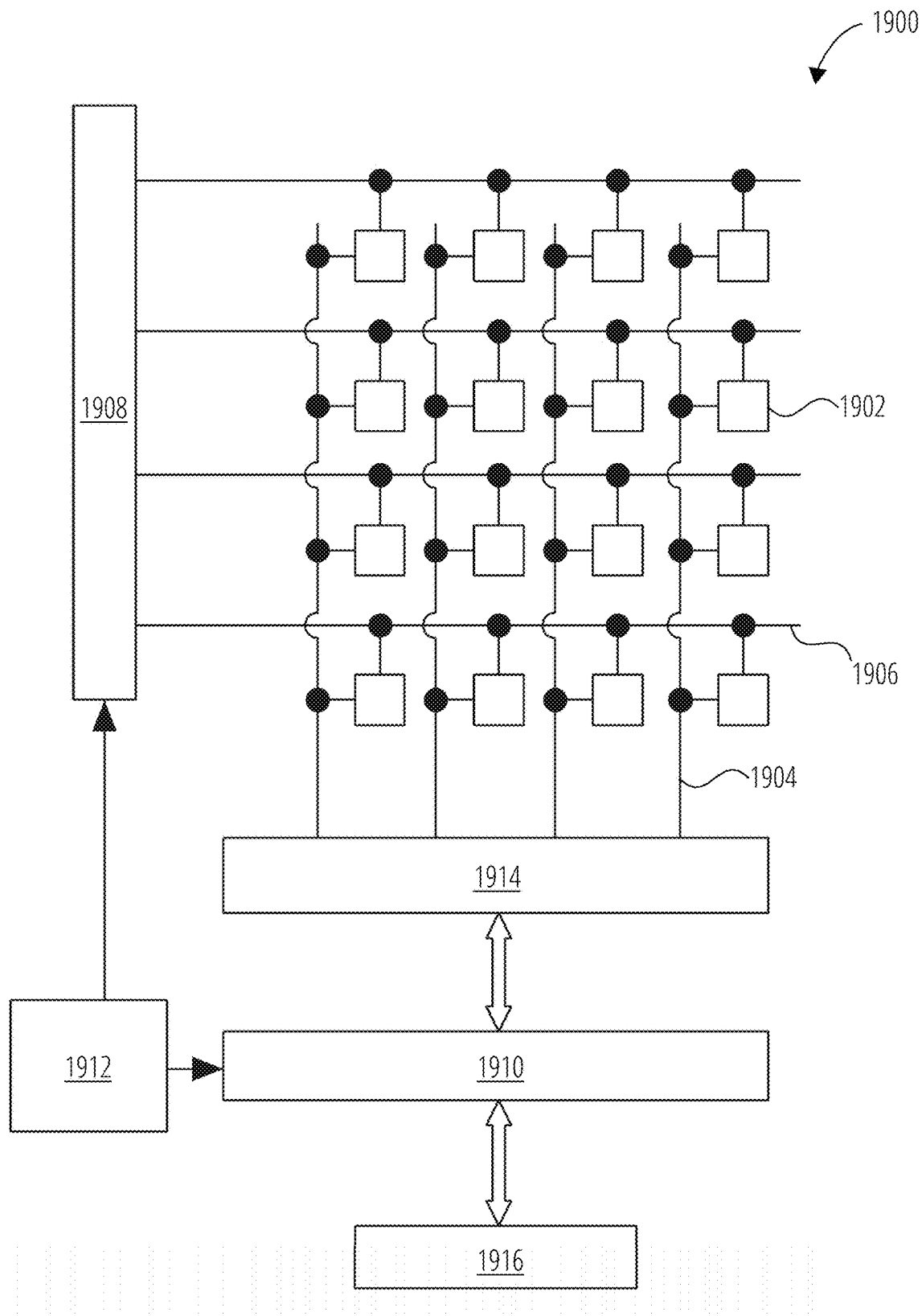
FIG. 19 is a functional block diagram of a memory device, in accordance with embodiments of the disclosure.

FIG. 19 illustrates a functional block diagram of a microelectronic device in the form of a memory device 1900 (e.g., a DRAM device), in accordance with an embodiment of the disclosure. The memory device 1900 may include, for example, an embodiment of one of the apparatuses (e.g., the microelectronic device structure 1000 of FIG. 10, the microelectronic device structure 1800 of FIG. 18) previously described herein. As shown in FIG. 19, the memory device 1900 may include memory cells 1902, digit lines 1904, word lines 1906, a row decoder 1908, a column decoder 1910, a memory controller 1912, a sense device 1914, and an input/output device 1916.

The memory cells 1902 of the memory device 1900 are programmable to at least two different logic states (e.g., logic 0 and logic 1). Portions of the apparatuses (e.g., the microelectronic device structure 1000 of FIG. 10, the microelectronic device structure 1800 of FIG. 18) previously described herein may form portions of the memory cells 1902 of the memory device 1900. Each of the memory cells 1902 may individually include a storage node structure and a transistor. The storage node structure stores a charge representative of the programmable logic state (e.g., a charged capacitor may represent a first logic state, such as a logic 1; and an uncharged capacitor may represent a second logic state, such as a logic 0) of the memory cells 1902. The transistor grants access to the capacitor upon application of a minimum threshold voltage to a semiconductive channel thereof for operations (e.g., reading, writing, rewriting) on the storage node structure.

The digit lines 1904 are connected to the storage node structures of the memory cells 1902 by way of the transistors of the memory cells 1902. The word lines 1906 extend perpendicular to the digit lines 1904 and are connected to gates (e.g., gate 1114 of FIG. 18) of the transistors of the memory cells 1902. Operations may be performed on the memory cells 1902 by activating appropriate digit lines 1904 and word lines 1906. Activating one of the digit lines 1904 or one of the word lines 1906 may include applying a voltage potential to the one of the digit lines 1904 or the one of the word lines 1906. Each column of the memory cells 1902 may individually be connected to one of the digit lines 1904, and each row of the memory cells 1902 may individually be connected to one of the word lines 1906. Individual memory cells 1902 may be addressed and accessed through the intersections (e.g., cross points) of the digit lines 1904 and the word lines 1906.

The memory controller 1912 may control the operations of the memory cells 1902 through various components, including the row decoder 1908, the column decoder 1910, and the sense device 1914. The memory controller 1912 may generate row address signals that are directed to the row decoder 1908 to activate (e.g., apply a voltage potential to) predetermined word lines 1906, and may generate column address signals that are directed to the column decoder 1910 to activate (e.g., apply a voltage potential to) predetermined digit lines 1904. The memory controller 1912 may also generate and control various voltage potentials employed during the operation of the memory device 1900. In general, the amplitude, shape, and/or duration of an applied voltage may be adjusted (e.g., varied) and may be different for various operations of the memory device 1900.

During use and operation of the memory device 1900, after being accessed, one of the memory cells 1902 may be read (e.g., sensed) by the sense device 1914. The sense device 1914 may compare a signal (e.g., a voltage) of an appropriate one of the digit lines 1904 to a reference signal in order to determine the logic state of the one of the memory cells 1902. If, for example, the one of the digit lines 1904 has a higher voltage than the reference voltage, the sense device 1914 may determine that the stored logic state of the memory cells 1902 is a logic 1, and vice versa. The sense device 1914 may include transistors and amplifiers to detect and amplify a difference in the signals (commonly referred to in the art as "latching"). The detected logic state of a memory cell of the memory cells 1902 may be output through the column decoder 1910 to the input/output device 1916. In addition, a memory cell of the memory cells 1902 may be set (e.g., written) by similarly activating an appropriate one of the word lines 1906 and an appropriate one of the digit lines 1904 of the memory device 1900. By controlling the one of the digit lines 1904 while the one of the word lines 1906 is activated, the one of the memory cells 1902 may be set (e.g., a logic value may be stored in the one of the memory cells 1902). The column decoder 1910 may accept data from the input/output device 1916 to be written to the memory cells 1902. Furthermore, a memory cell of the memory cells 1902 may also be refreshed (e.g., recharged) by reading each of that memory cell of the memory cells 1902. The read operation will place the contents of that memory cell of the memory cells 1902 on the appropriate one of the digit lines 1904, which is then pulled up to full level (e.g., full charge or discharge) by the sense device 1914. When one of the word lines 1906, associated with that memory cell of the memory cells 1902 is deactivated, all of the memory cells 1902 in the row associated with the one of the word lines 1906 are restored to full charge or discharge.

Figure 20:
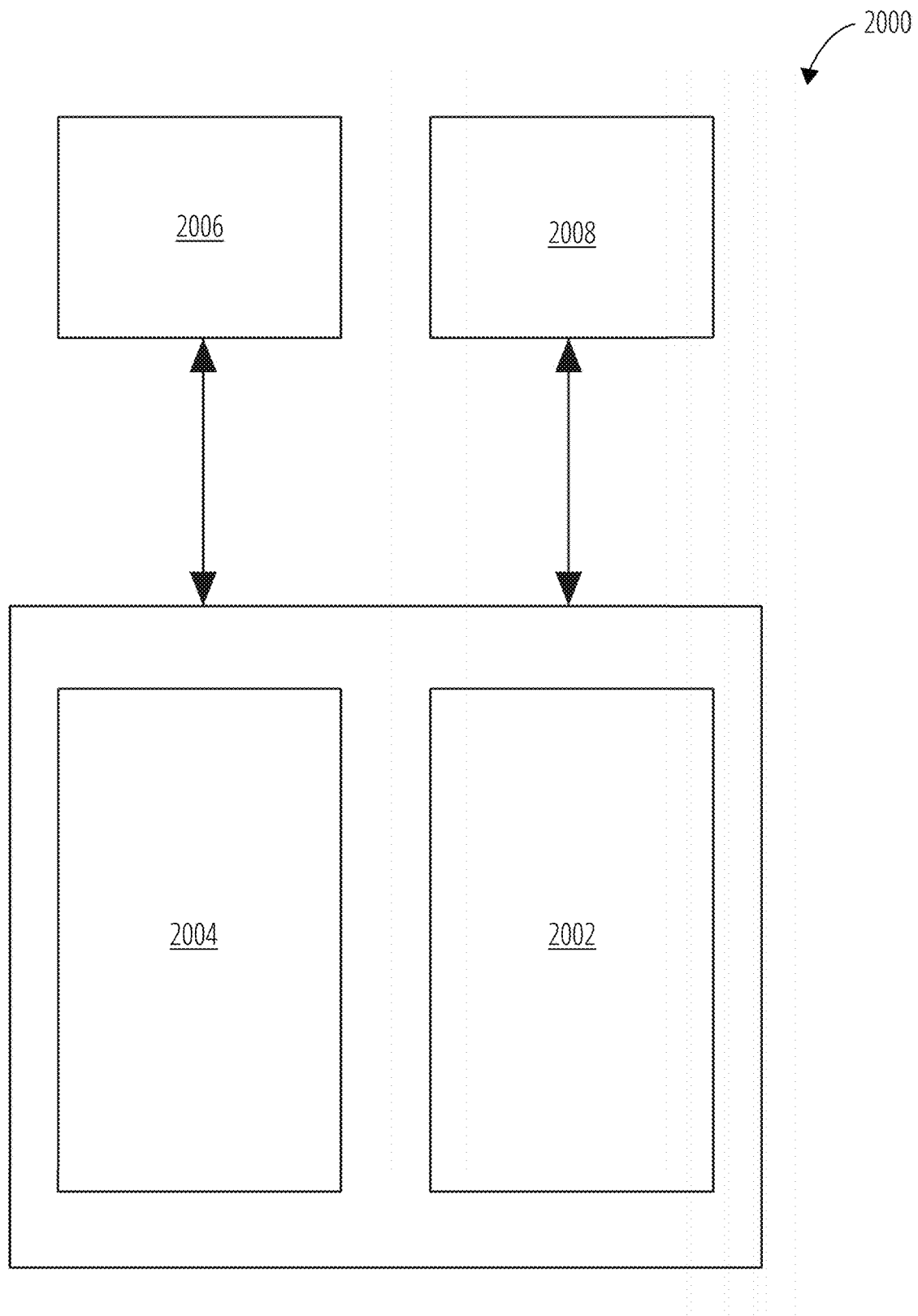
FIG. 20 is a schematic block diagram of an electronic system, in accordance with embodiments of the disclosure.

Apparatuses (e.g., the microelectronic device structure 1000 of FIG. 10, the microelectronic device structure 1800 of FIG. 18) and microelectronic devices (e.g., the memory device 1900 of FIG. 19) in accordance with embodiments of the disclosure may be used in embodiments of electronic systems of the disclosure. For example, FIG. 20 is a block diagram of an illustrative electronic system 2000 according to embodiments of disclosure. The electronic system 2000 may comprise, for example, one or more of a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, and a navigation device. The electronic system 2000 includes at least one memory device 2002. The memory device 2002 may comprise, for example, an embodiment of one or more of apparatuses (e.g., one or more of the microelectronic device structure 1000 of FIG. 1 and/or the microelectronic device structure 1800 of FIG. 18) incorporated in a microelectronic device (e.g., the memory device 1900 of FIG. 19) previously described herein. The electronic system 2000 may further include at least one electronic signal processor device 2004 (often referred to as a "microprocessor"). The electronic signal processor device 2004 may, optionally, include an embodiment of an apparatus (e.g., one of the microelectronic device structure 1000 of FIG. 10 and/or the microelectronic device structure 1800 of FIG. 18) incorporated in a semiconductor device (e.g., the memory device 1900) previously described herein, such an arrangement often being termed a "system on a chip" (SoC). The electronic system 2000 may further include one or more input device 2006 for inputting information into the electronic system 2000 by a user, such as, for example, a mouse or other pointing device, a keyboard, a touchpad, a button, or a control panel. The electronic system 2000 may further include one or more output device 2008 for outputting information (e.g., visual or audio output) to a user such as, for example, a monitor, a display, a printer, an audio output jack, a speaker, etc. In some embodiments, the input device 2006 and the output device 2008 may comprise a single touchscreen device that can be used both to input information to the electronic system 2000 and to output visual information to a user. The input device 2006 and the output device 2008 may communicate electrically with one or more of the memory device 2002 and the electronic signal processor device 2004.

Accordingly, disclosed is an electronic system comprising at least one memory device, at least one electronic signal processor, at least one input device, and at least one output device. The at least one memory device comprises at least one digit line and at least one word line in operable communication with at least one memory cell. The at least one memory cell comprises at least one conductive contact structure within metal nitride liners. The metal nitride liners comprise a first metal nitride liner and a second metal nitride liner. The at least one memory cell also comprises a metal silicide material on a polysilicon structure. The second metal nitride liner is disposed directly between the metal silicide material and the at least one conductive contact structure. The at least one electronic signal processor is in operable connection with the at least one memory device. The at least one input device is in operable communication with the at least one electronic signal processor. The at least one output device is in operable communication with the at least one input device.

The methods, apparatuses (e.g., structures), devices (e.g., microelectronic devices, such as memory devices, such as DRAM devices), and electronic systems of the disclosure may facilitate one or more of increased performance, increased efficiency, increased reliability, and increased durability as compared to conventional methods, conventional apparatuses, conventional devices, and conventional electronic systems.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:

1. A microelectronic device, comprising:
at least one conductive contact structure over a metal silicide material, the at least one conductive contact structure extending through at least one dielectric material;
a first metal nitride liner on vertical sidewalls of the at least one conductive contact structure, the metal silicide material extending under the first metal nitride liner, the first metal nitride liner being directly adjacent the at least one dielectric material; and
a second metal nitride liner between the at least one conductive contact structure and the metal silicide material.

2. The microelectronic device of claim 1, wherein the first metal nitride liner does not extend under the at least one conductive contact structure.

3. The microelectronic device of claim 1, wherein:
the metal silicide material comprises cobalt silicide;
the first metal nitride liner and the second metal nitride liner comprise titanium nitride; and
the at least one conductive contact structure comprises tungsten.

4. The microelectronic device of claim 1, wherein the second metal nitride liner extends from and between the at least one conductive contact structure and the metal silicide material.

5. The microelectronic device of claim 1, wherein the microelectronic device comprises a dynamic random access memory device.

6. The microelectronic device of claim 1, wherein an upper longitudinal end of the first metal nitride liner is directly laterally between the second metal nitride liner and the at least one dielectric material.

7. The microelectronic device of claim 1, wherein a lower longitudinal end of the first metal nitride liner is directly laterally between the second metal nitride liner and the at least one dielectric material.

8. The microelectronic device of claim 1, wherein the at least one dielectric material is in direct contact with the metal silicide material.

9. A microelectronic device, comprising:
a conductive contact structure laterally adjacent an electrically insulated conductive region, the conductive contact structure extending through at least one dielectric material;
a silicide region under the conductive contact structure;
a single metal nitride liner directly between the silicide region and the conductive contact structure; and
an additional metal nitride liner laterally surrounding the conductive contact structure and laterally adjacent the single metal nitride liner, the additional metal nitride liner being in direct contact with the at least one dielectric material,
wherein the silicide region extends under the additional metal nitride liner.

* * * * *

UNITED STATES PATENT AND TRADEMARK OFFICE
CERTIFICATE OF CORRECTION

PATENT NO. : 11,043,414 B2  
APPLICATION NO. : 16/654865  
DATED : June 22, 2021  
INVENTOR(S) : Kenichi Kusumoto et al.

Page 1 of 1

It is certified that error appears in the above-identified patent and that said Letters Patent is hereby corrected as shown below:

In the Specification

| | | |
|---|---|---|
| Column 2, | Line 55, | change "Sift" to --$SiO_2$-- |
| Column 7, | Line 9, | change ""y,"and" to --"y", and-- |
| Column 7, | Line 16, | change ""y,"and/or" to --"y," and/or-- |
| Column 13, | Line 15, | change "Sift" to --$SiO_2$-- |

Signed and Sealed this  
Third Day of August, 2021

Drew Hirshfeld  
*Performing the Functions and Duties of the*  
*Under Secretary of Commerce for Intellectual Property and*  
*Director of the United States Patent and Trademark Office*